United States Patent
Browning et al.

(10) Patent No.: US 9,279,189 B2
(45) Date of Patent: Mar. 8, 2016

(54) METHODS FOR FORMING DEFECT-FREE ANODIZED PARTS

(71) Applicant: Apple Inc., Cupertino, CA (US)

(72) Inventors: Lucy Elizabeth Browning, San Francisco, CA (US); Masashige Tatebe, Kakogawa (JP); Shi Hua Zhang, Wilmington, DE (US); Michael W. Barnstead, Canton, CT (US); Richard M. Bretherton, Portland, OR (US); Takahiro Oshima, Tokyo (JP); Sean A. Backs, Belmont, CA (US); Duy P. Le, San Francisco, CA (US); Andrew J. Meschke, San Jose, CA (US); Thomas Johannessen, Fjerdingby (NO)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/585,021

(22) Filed: Dec. 29, 2014

(65) Prior Publication Data
US 2015/0315715 A1 Nov. 5, 2015

Related U.S. Application Data

(63) Continuation of application No. PCT/US2014/072567, filed on Dec. 29, 2014.

(60) Provisional application No. 61/988,807, filed on May 5, 2014.

(51) Int. Cl.
 *C25D 5/02* (2006.01)
 *H05K 5/04* (2006.01)

(52) U.S. Cl.
 CPC  *C25D 5/022* (2013.01); *H05K 5/04* (2013.01); *Y10T 428/24033* (2015.01); *Y10T 428/31678* (2015.04)

(58) Field of Classification Search
 CPC .. C25D 5/022; H05K 5/04; Y10T 428/24033; Y10T 428/31678
 See application file for complete search history.

(56) References Cited

U.S. PATENT DOCUMENTS

| 2004/0035709 | A1 | 2/2004 | Uzoh |
| 2012/0152748 | A1 | 6/2012 | Araki et al. |
| 2013/0075026 | A1 | 3/2013 | Chang et al. |
| 2013/0112565 | A1 | 5/2013 | Filson et al. |
| 2013/0292161 | A1 | 11/2013 | Liu et al. |

FOREIGN PATENT DOCUMENTS

WO 2012079040 6/2012

OTHER PUBLICATIONS

PCT/US2014/072567 International Search Report & Written Opinion dated Apr. 27, 2015.

*Primary Examiner* — Michael C Miggins
(74) *Attorney, Agent, or Firm* — Downey Brand LLP

(57) ABSTRACT

Manufacturing methods related to anodizing of metal parts are described. In particular, pre-anodizing and post-anodizing methods for forming a consistent and defect-free interface between metal and non-metal sections of a part are described. Methods involve preventing residues from various manufacturing processes from entering a gap or space at the interface between the metal and non-metal section of the part and that can disrupt subsequent anodizing and anodic film dyeing processes. In particular embodiments, methods involve forming a barrier layer or filler layer between the metal and non-metal sections. Portions of the barrier layer or filler layer can be removed prior to anodizing. The resultant part has a well-defined and uniform space between the metal and non-metal sections that is free from visual defects.

20 Claims, 18 Drawing Sheets

METHODS FOR FORMING DEFECT-FREE ANODIZED PARTS

CROSS-REFERENCE TO RELATED APPLICATION

This is a continuation of International Application PCT/US14/72567, with an international filing date of Dec. 29, 2014, entitled "Methods For Forming Defect-Free Anodized Parts", which claims priority to U.S. Provisional Application No. 61/988,807 filed May 5, 2014 entitled "Methods For Forming Defect-Free Anodized Parts", each of which is incorporated herein by reference in its entirety.

FIELD

This disclosure relates generally to anodizing techniques and anodized structures. In particular, methods for anodizing parts having metal and non-metal sections are described. The methods can be used to form a consistent and defect-free interface between the metal and non-metal sections.

BACKGROUND

Anodizing is a process used in many manufacturing product lines to provide protective and cosmetically appealing surfaces to metal portions of a part. During an anodizing process, a part is exposed to an electrolytic process whereby the part acts as an anode. The process forms a metal oxide layer or anodic film on surfaces of a part. The metal oxide layer can enhance the durability and corrosion resistance of the part. In addition, the metal oxide layer has a porous structure that can accept any of a number of dyes. These dyes can be infused within the porous structures of the metal oxide to give the part a particular color.

In addition to anodizing, products typically undergo a number of other manufacturing processes. For instance, the part can undergo any of a number of metal shaping processes such as machining (e.g., cutting, milling, etc.), forging, extruding. In addition, the part typically undergoes any of number of surface treatment processes, such as polishing, etching and blasting procedures. Many times, consumer products are composite parts that include metal and non-metal sections, such as plastic or glass sections. Residues from the various manufacturing processes, such as chemical residues, can get trapped within gaps and crevices between the metal and non-metal sections, which can detrimentally affect a subsequent anodizing process and cause defects in the resultant metal oxide film. In some cases, these defects can be visible, especially if the metal oxide film is dyed.

SUMMARY

This paper describes various embodiments that relate to treating metal substrates and electroplating onto metal substrates.

According to one embodiment, a method of forming a housing for an electronic device is described. The housing includes an anodizable section and non-anodizable section. The method includes forming a boundary layer on the anodizable section. The boundary layer is configured to prevent exposure of the anodizable section to a chemical agent that causes the anodizable section to form a corrosion product that is associated with defects. The method also includes molding the non-anodizable section onto the boundary layer such that the boundary layer is situated between the anodizable section and non-anodizable section at a junction region. The method further includes removing a portion of the boundary layer exposing a surface of the anodizable section. The method additionally includes converting the exposed surface to a metal oxide layer. The boundary layer prevents formation of the corrosion product at the junction region during one or more of the molding, removing, and converting such that the junction region is defect-free.

According to another embodiment, a method of forming a housing for an electronic device is described. The housing includes a metal section and a plastic section. The method includes forming a boundary layer on the metal section. A first portion of the boundary layer is formed on a first surface of the metal section and a second portion of the boundary layer is formed on a second surface of the metal section. The boundary layer is configured to prevent exposure of the metal section to a chemical agent that causes the metal section to form a corrosion product that is associated with defects. The method additionally includes molding the plastic section onto the first portion of the boundary layer such that the boundary layer is situated between the metal section and plastic section at a junction region. The method also includes removing the second portion of the boundary layer exposing a surface of the metal section. The method further includes converting the exposed surface to a metal oxide layer. The boundary layer prevents formation of the corrosion product at the junction region during one or more of the molding, removing, and converting such that the junction region is defect-free.

According to a further embodiment, a housing for an electronic device. The housing includes a metal section having a first surface and a second surface that meet at a corner. The first surface has a boundary layer positioned thereon and the second surface has a metal oxide layer positioned thereon. The boundary layer has a substantially uniform thickness. An exposed surface of the metal oxide layer corresponds to an exterior surface of the housing. The housing also includes a plastic section directly adjacent the boundary layer such that the boundary layer is positioned between the plastic section and the first surface of the metal section.

These and other embodiments will be described in detail below.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1A:
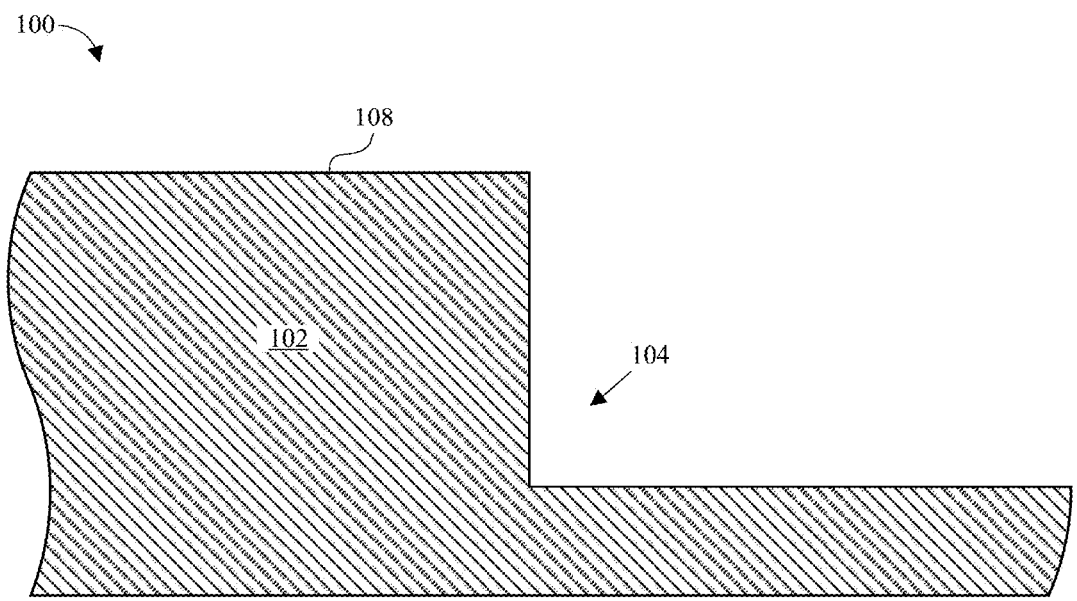
FIGS. 1A-1F show cross-section views of a portion of a part at various stages of a gap filling and anodizing process in accordance with described embodiments.

Reference will now be made in detail to representative embodiments illustrated in the accompanying drawings. It should be understood that the following descriptions are not intended to limit the embodiments to one preferred embodiment. To the contrary, they are intended to cover alternatives, modifications, and equivalents as can be included within the spirit and scope of the described embodiments as defined by the appended claims.

The following disclosure pertains to techniques related to anodizing of metal parts. In particular, pre-anodizing and post-anodizing methods for forming a consistent interface between metal and non-metal sections of a part are described. In addition, the interface between the metal and non-metal section are free from visible defects related to dyeing of an anodic film. Methods described involve preventing residues from various manufacturing processes from entering a gap or space at the interface between the metal and non-metal section of the part. If left within the gaps, these residues can disrupt subsequent anodizing and anodic film dyeing processes. In particular embodiments, methods involve filling the gap with a filler material or filler layer prior to exposure to the various manufacturing processes. The filler material can then be removed prior to anodizing and anodic film dyeing.

The methods described herein are well suited for providing both protective and attractive surfaces to visible portions of consumer products. For example, methods described herein can be used to provide protective and cosmetically appealing exterior portions of metal housings and casings for electronic devices, such as those manufactured by Apple Inc., based in Cupertino, Calif. In particular embodiments, the methods are used to form protective coatings for exterior metallic surfaces of computers, portable electronic devices and/or accessories for electronic devices.

These and other embodiments are discussed below with reference to FIGS. 1-8. However, those skilled in the art will readily appreciate that the detailed description given herein with respect to these Figures is for explanatory purposes only and should not be construed as limiting.

Many consumer products are composite parts that include metal portions and non-metal sections. Forming these composite parts can involve any of a number of shaping, machining, molding and surface treatment processes. Residues, such as chemical residues, from these various manufacturing process can get caught within gaps between the metal and non-metal sections and remain within the gaps during subsequent anodizing and dyeing processes. In some cases, the residues include chemical agents used in chemical polishing (e.g., phosphoric acid) and/or agents from electrolytic processes (e.g., phosphoric acid and/or sulfuric acid). These trapped residues can be released out of the gaps during subsequent processes and cause visible defects in the part. For example, the residues can disrupt the intake of dye within a metal oxide layer in localized areas at the interface between the metal and non-metal sections of the part, causing visible defects along this interface. Methods described herein involve filling the gaps with a filler material prior to exposing the part to pre-anodizing processes, thereby preventing residues from entering the gaps.

FIGS. 1A-1F show cross-section views of a portion of part 100 at various stages of a gap filling and anodizing process in accordance with described embodiments. At FIG. 1A, part 100 includes anodizable section 102. Anodizable section 102 includes an anodizable metal, such as aluminum and/or titanium. In some embodiments, anodizable section 102 includes a metal alloy of an anodizable metal, such as an aluminum alloy. Part 100 includes cut out section 104, having a shape and size configured to accept a non-anodizable section using, for example, a molding process. Cut out section 104 can be formed using any suitable technique. For example, one or more machining processes can be used to form cut out section 104. In some embodiments, part 100 is a portion of a housing for a consumer product, such as a housing for an electronic device. In some embodiments, surface 108 corresponds to an exterior surface of a housing.

Figure 1B:
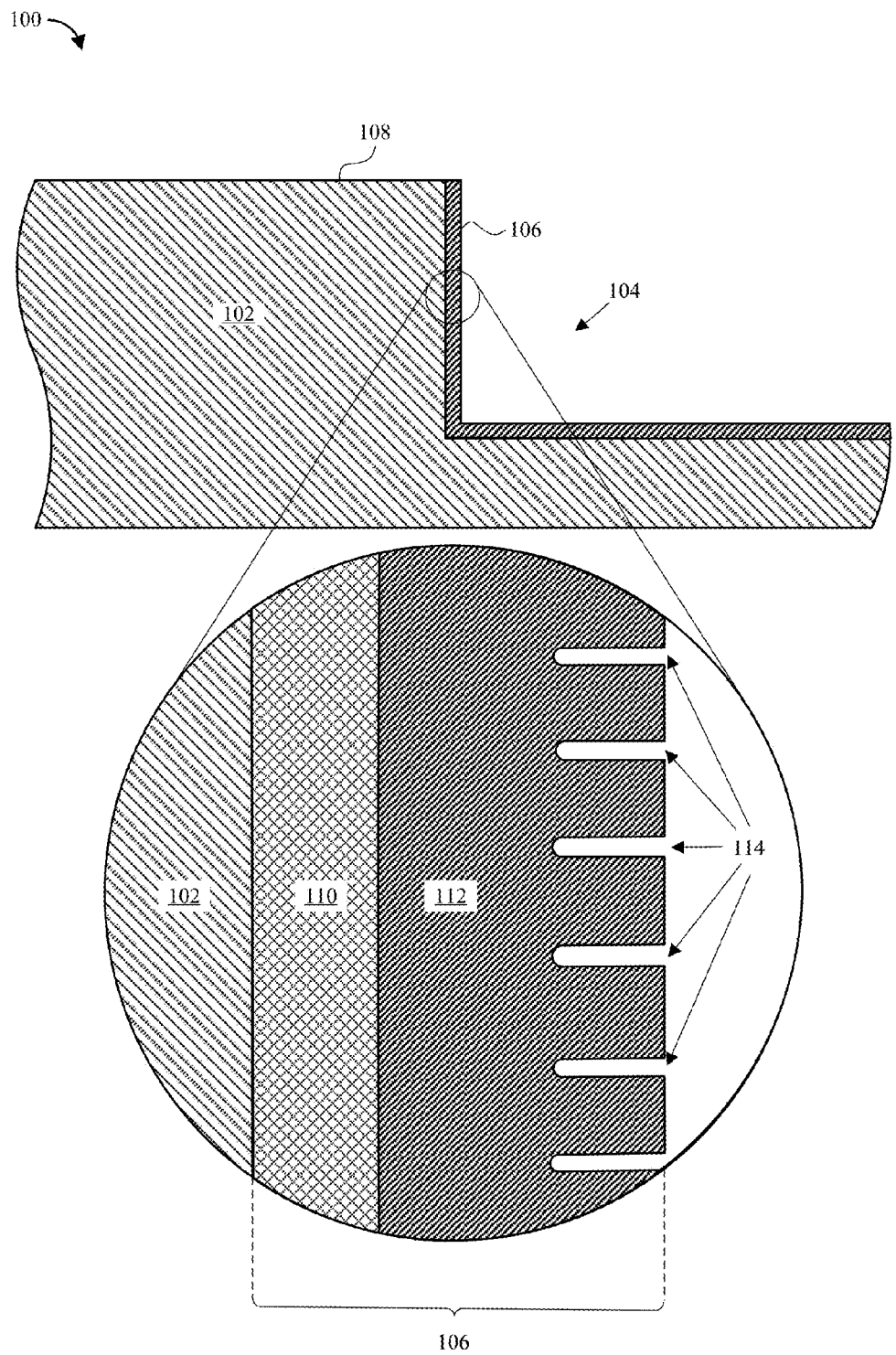

At FIG. 1B, filler layer 106 is deposited on a surface of part 100 corresponding to cut out section 104. Filler layer 106 can be made of any material suitable for preventing material from entering within a gap formed between anodizable section 102 and a subsequently formed non-anodizable section. In some embodiments, filler layer 106 is made of a metal material, such as nickel and/or copper. Filler layer 106 can be deposited using any suitable technique. In some embodiments, filler layer 106 is deposited using a plating process. In some embodiments, surface 108 of part 100 is masked prior to forming filler layer 106 onto part 100. After filler layer 106 is deposited, the mask can be removed. In other embodiments, filler layer 106 is initially deposited onto exposed surfaces of part 100, including surface 108. Then, portions of filler layer 106 on surface 108 are removed.

The inset view of FIG. 1B shows a close-up view of a portion of part 100. As shown in the inset view, in some embodiments, filler layer 106 can include sub-layers. That is, filler layer 106 can include first layer 110, directly deposited on anodizable section 102, and second layer 112, deposited on first layer 110. In some embodiments, second layer 112 has a porous structure that includes pores 114. In some embodiments, the average diameter of pores 114 is about 5 micrometers or greater. Pores 114 can engage with a subsequently deposited non-anodizable section, which will be described in detail below. In some embodiments, second layer 112 has a rough topology that includes a number of engagement surfaces that can also engage with a subsequently deposited non-anodizable section. In some embodiments, second layer 112 includes a rough topology and pores 114. In some embodiments, first layer 110 is an electrolessly deposited metal, such as electrolessly deposited nickel. Any suitable electroless disposition process can be used. Electrolessly depositing generally provides a first layer 110 that adheres well to anodizable section 102 and gives first layer 110 a uniform thickness distribution. In some embodiments, second layer 112 is an electroplated metal. Any suitable electroplating process can be used. Electroplating generally provides a thicker layer of metal than electroless deposition. In some embodiments, second layer 112 is an electroplated porous nickel layer that includes pores 114. The electroplating process conditions can be optimized to give second layer 112 a substantially uniform thickness. This way, a subsequently formed gap between anodizable section 102 and a subsequently formed non-anodizable section is uniform and cosmetically appealing.

The thicknesses of each of first layer 110 and second layer 112, as well as the overall thickness of filler layer 106, can vary depending on particular design requirements. First layer 110 deposited using electroless deposition is generally thinner than second layer 112 deposited using plating techniques. In some case, it is desirable that the thickness of filler layer 106 be thick enough to provide a wide enough space for sufficient cleaning during a post-anodizing cleaning process, which will be described in detail below. However, for cosmetic reasons, filler layer 106 should have a suitably small thickness variation such that resulting space between anodizable section 102 and an adjacent non-anodizable section has a consistent width. However, it can be difficult to form a very thick second layer 112 with small thickness variation using electroplating techniques. That is, the thicker second layer 112 is electroplated on, the more thickness variation second layer 112 will have. Thus, a balance between providing a filler layer 106 that is thick enough for sufficient cleaning during a post-anodizing cleaning process and thin enough such that filler layer 106 has a small thickness variation should be considered. As describe above, to minimize thickness variation of filler layer 106, in some embodiments an electroless plating process (e.g., electroless nickel) can be used to deposit first layer 110. Since there is no current in electroless plating, there is no current density variation across the part, which drives growth rate differences. In some embodiments, substantially all of filler layer 106 is deposited using electroless plating. In some embodiments, filler layer 106 has a thickness ranging from about 5 to 30 micrometers. In some embodiments, filler layer 106 has a thickness ranging from about 10 to 20 micrometers. Note that in some embodiments filler layer 106 is made of a single layer and not two layers, as shown in FIG. 1B. In other embodiments, filler layer 106 includes three or more layers.

Figure 1C:
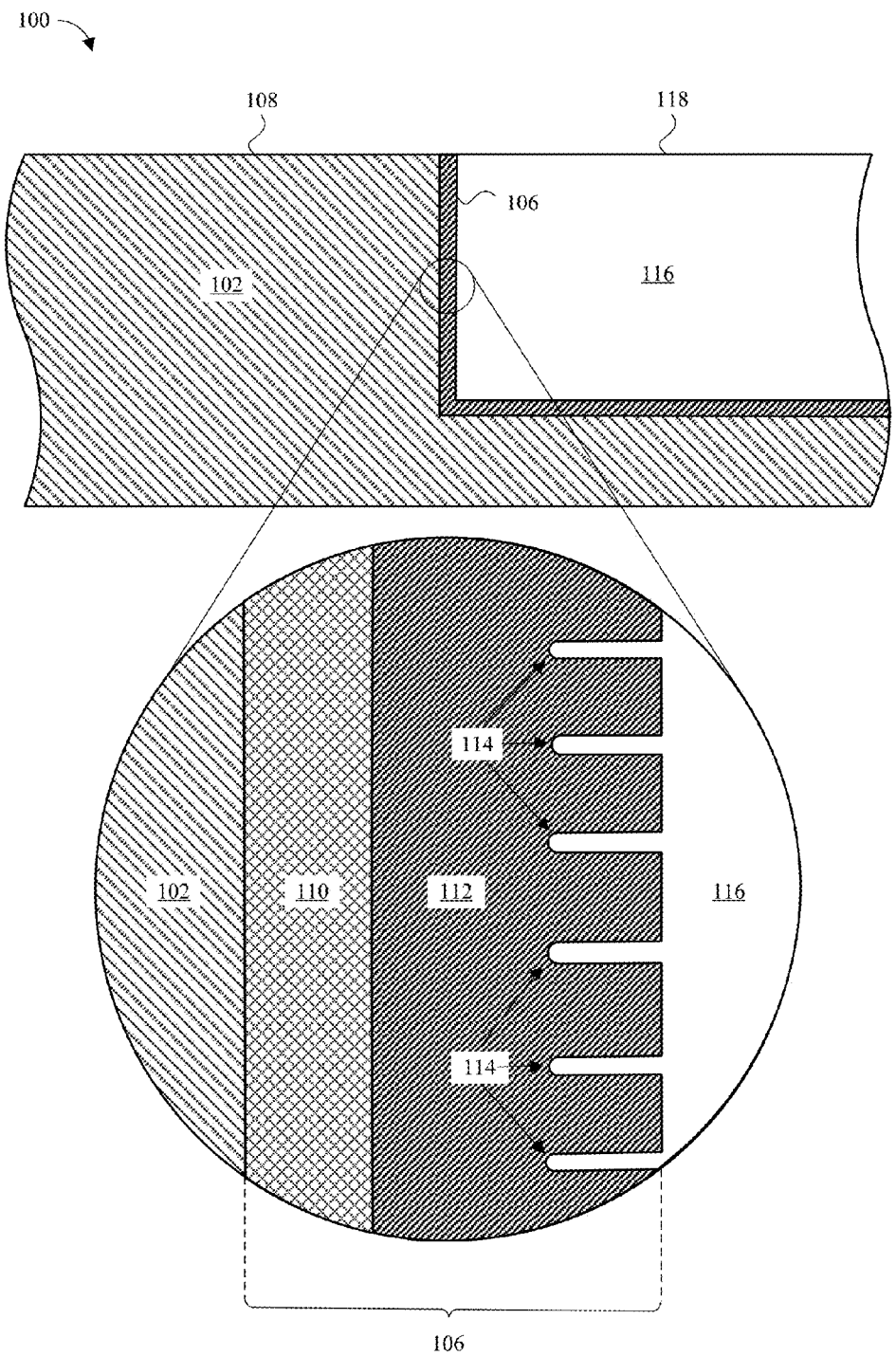

At FIG. 1C, non-anodizable section 116 is incorporated into part 100. Non-anodizable section 116 is generally made of a material that does not form an oxide layer when exposed to an anodizing process. Non-anodizable section 116 can correspond, for example, to a plastic, ceramic or glass portion of part 100. In some embodiments, non-anodizable section 116 is made of a radio frequency transparent material (e.g., radio frequency transparent plastic) that allows radio frequency waves to pass there through. This can be useful in applications where part 100 corresponds to a housing for an electronic device having a radio frequency antenna and portions of the housing should allow for radio frequency communication to and/or from the radio frequency antenna. In some embodiments, non-anodizable section 116 is formed using a molding process wherein a molten material, such as melted plastic, is deposited within cut out section 104 and allowed to harden. In this way, non-anodizable section 116 can take on a shape corresponding to cut out section 104. As shown in the inset view, in embodiments where second layer 112 has pores 114, portions of non-anodizable section 116 can deposit within pores 114 of second layer 112. After non-anodizable section 116 hardens, the portions of non-anodizable section 116 deposited within pores 114 engage with the side walls of pores 114, thereby securing non-anodizable section 116 to second layer 112 and to anodizable section 102. In addition, this can create a tight seal between non-anodizable section 116 and second layer 112 that helps prevent entrance of residues during subsequent manufacturing processes. Note that in embodiments where second layer 112 has a rough topology instead of or in addition to pores 114, the engagement surfaces of the rough topology can also engage with non-anodizable section 116. That is, non-anodizable section 116 engages with the engagement surfaces of second layer 112.

In some embodiments, the type of material for non-anodizable section 116 is chosen, in part, based on the ability to flow and deposit within pores 114. For example, plastics with lower viscosities will generally flow more easily within pores 114. However, other factors such as durability should be taken into account when choosing the material for non-anodizable section 116. In particular, lower viscosity plastics may flow more easily but may not provide sufficient durability when hardened compared to higher viscosity plastics. Thus, these considerations should be taken into account when choosing materials for non-anodizable section 116. In some embodiments, pores 114 have a large enough average diameter to accommodate higher viscosity plastics. As described above, in some embodiments, pores 114 have an average diameter of about 5 micrometers or more.

After non-anodizable section 116 is incorporated into part 100 (e.g., plastic has hardened), part 100 can undergo one or more manufacturing processes. Filler layer 106 can prevent residues and other artifacts from these manufacturing processes from entering between anodizable section 102 and non-anodizable section 116. Typical manufacturing processes can include shaping, machining and surface treatment processes. For example, surface 108 of anodizable section 102 and surface 118 of non-anodizable section 116 can be co-finished using a polishing process to form a continuous smooth surface for composite part 100. In some cases, one or both of surfaces 108 and 118 are exposed to a texturing process, such as a blasting process. A masking process can be used to cover one or both of surface 108 and 118 during any of these surface finishing procedures, if suitable.

Figure 1D:
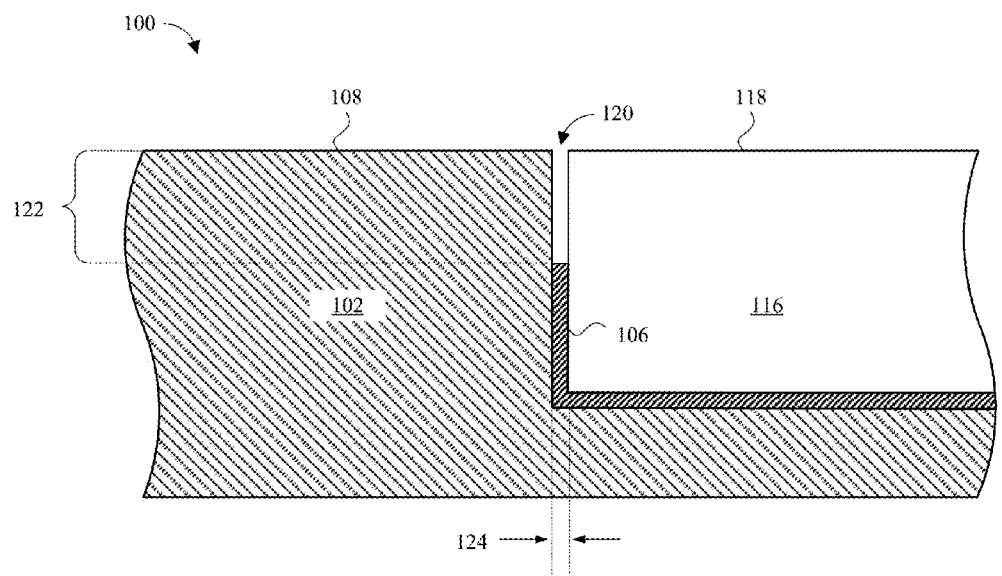

At FIG. 1D, a portion of filler layer 106 is removed leaving gap 120 between anodizable section 102 and non-anodizable section 116. In particular, a portion of filler layer 106 that is near exposed surfaces 108 and 118 is removed. In some embodiments, gap 120 corresponds to a channel that runs around a perimeter of anodizable section 102. As shown, a portion of filler layer 106 remains within part 100 tightly securing non-anodizable section 116 to anodizable section 102. In other embodiments, substantially all of filler layer 106 is removed. The amount of filler layer 106 removed and the depth 122 of gap 120 can depend on the removal technique and process parameters of the removal technique. As described above, the width 124 of gap 120 will depend on the thickness of filler layer 106.

In embodiments wherein filler layer 106 includes a metal, an electrolytic process can be used to dissolve the removed portion of filler layer 106 into an electrolytic bath. In some embodiments, an electrolytic bath suitable for an anodizing process can be used. In a particular embodiment, a sulfuric acid electrolytic bath is used. In some embodiments, the electrolytic process includes using a relatively low applied voltage compared to a typical anodizing process. That is, the applied voltage is kept at a sufficiently high voltage for efficient removal of filler layer 106 but sufficiently low voltage to avoid anodizing of anodizable section 102 once filler layer 106 is removed. In some embodiments, the process parameters for electrolytically removing filler layer 106 are optimized for providing a gap 120 with a large and consistent depth 122. Details regarding some electrolytic processes suitable for removing filler layer 106 are described below with reference to FIG. 5.

After a portion or all of filler layer 106 is removed, part 100 can optionally undergo one or more additional manufacturing processes. For example, one or more surface treatments, such as chemical polishing, can be performed after removal of filler layer 106. If any residues become trapped within gap 120 during these additional manufacturing processes, they can be removed during a subsequent post-anodizing cleaning process that will be described below. In other embodiments, part 100 goes straight to an anodizing process without undergoing additional manufacturing processes.

Figure 1E:
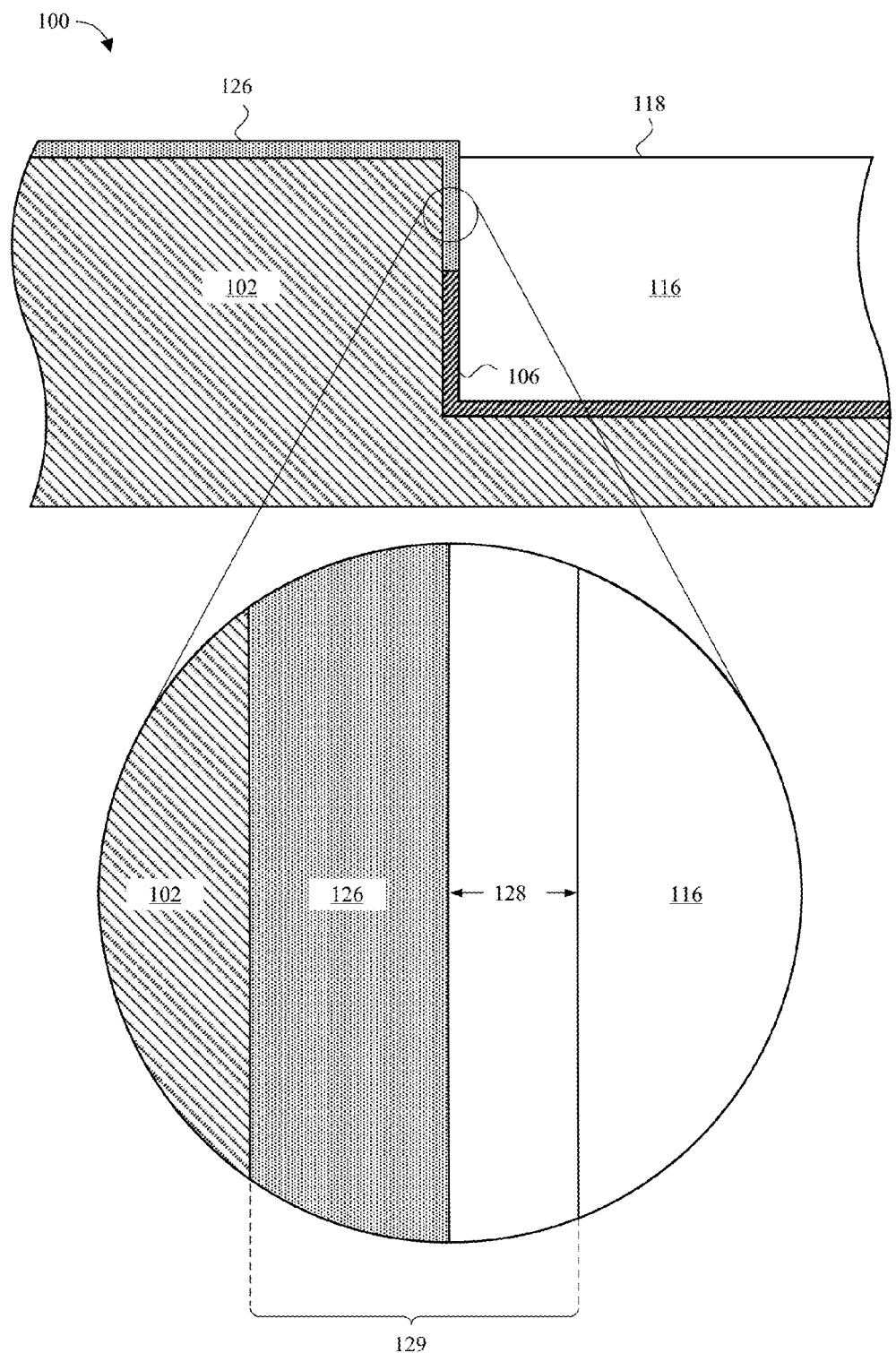

At FIG. 1E, part 100 is exposed to an anodizing process converting a surface portion of anodizable section 102 to metal oxide layer 126. In some embodiments, surface 118 of non-anodizable section 116 is masked prior to exposure to the anodizing process in order to protect degradation of non-anodizable section 116. In other embodiments, non-anodizable section 116 is made of a material sufficiently durable to withstand an anodizing process without degrading. Metal oxide layer 126 can provide a durable protective layer for anodizable section 102. For example, if anodizable section 102 is made of aluminum or aluminum alloy, metal oxide layer 126 can correspond to a protective aluminum oxide layer. Anodizing generally provides a conformal metal oxide layer 126 having a consistent thickness.

As shown in the inset view, in some embodiments, metal oxide layer 126 does not fully fill the width 124 of gap 120. That is, the thickness of metal oxide layer 126 can be less than the width 124 of gap 120, forming space 128 between metal oxide layer 126 and non-anodizable section 116. Note that in other embodiments, metal oxide layer 126 substantially fills gap 120 without forming a substantial space. The width of space 128 can depend on the thickness of metal oxide layer 126 and the width of gap 120. As described above, controlling the thickness of which filler layer 106 is deposited can determine the width 124 of gap 120. In some embodiments, a post-anodizing cleaning process is used to clean any further residue accumulated within space 128 prior to a dyeing process. The post-anodizing cleaning process can include, for example, exposing part 100 to an acidic solution that can chemically react with and cause the residues to dissolve in acidic solution. Thus, in some embodiments, space 128 can be designed to be sufficiently wide in order to provide thorough cleaning of space 128 during the post-anodizing cleaning process. Thus, the processes described above can be used to create a junction region or interface region 129 between anodizable section 102 and non-anodizable section 116 will have a consistent width. In addition, metal oxide layer 126 will be substantially free of visible defects.

Figure 1F:
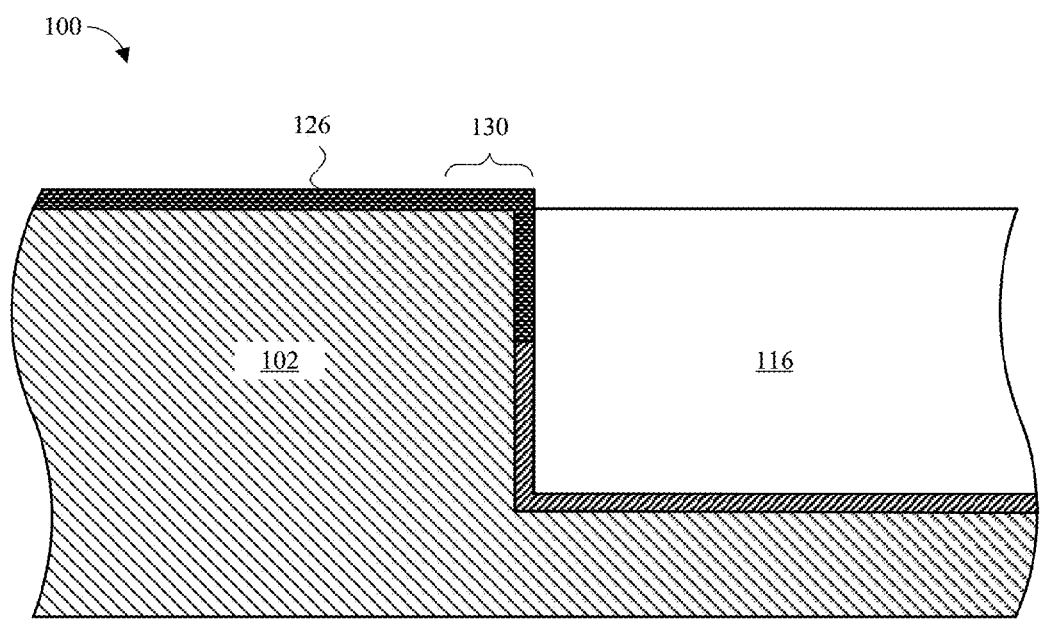

At FIG. 1F, part 100 is optionally exposed to a dyeing process wherein one or more dyes are infused within metal oxide layer 126. As a result, metal oxide layer 126 takes on a color corresponding to the dye/dyes. Substantially no residues will remain on or within metal oxide layer 126 at region 130 proximate non-anodizable section 116 that can inhibit the uptake of dye within metal oxide layer 126. Thus, region 130 will have a consistent color and be substantially free of visible defects.

In some cases, a part includes two or more non-anodizable sections. FIGS. 2A-2G show cross-section views of a portion of part 200, which includes two non-anodizable sections, at various stages of a gap filling and anodizing process in accordance with described embodiments. At FIG. 2A, opening 204 is formed within anodizable section 202. In some embodiments, part 200 is a metal housing with exterior surfaces 206 and opening 204 corresponds to a channel that runs along perimeters of metal portions of the housing. Opening 204 can be formed using any suitable process, including one or more machining, molding and shaping processes. Anodizable section 202 includes interlock features 208 that can help secure a subsequently formed non-anodizable section within opening 204. Interlock features 208 can have any suitable shapes. In some embodiments, interlock features 208 have tapered edges such that a subsequently formed non-anodizable section can engage with interlock features 208 in a dovetail design. In some embodiments, interlock features 208 have an undercut shape. According to some embodiments, a key criterion as to the shape of features 208 is that they can be completely filled by a subsequently formed non-anodizable section using, for example, an injection molding process. This can prevent forming difficult to clean voids where residues can be trapped.

Figure 2A:
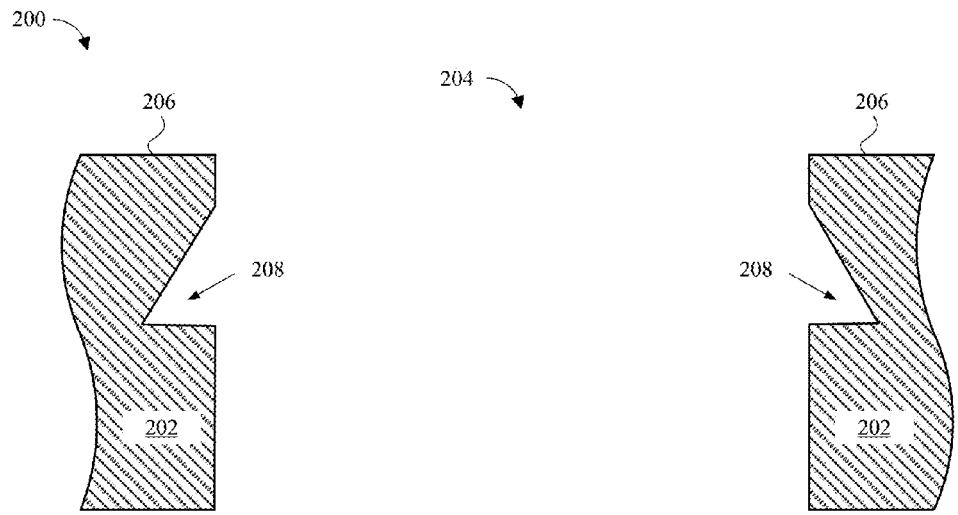
FIGS. 2A-2G show cross-section views of a portion of a part, which includes two non-anodizable sections, at various stages of a gap filling and anodizing process in accordance with described embodiments.
Figure 2B:
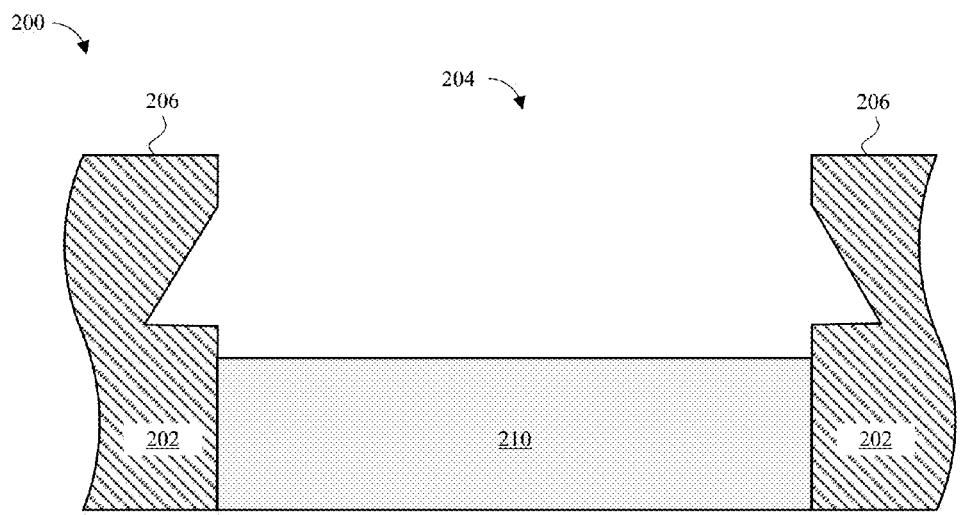

At FIG. 2B, first non-anodizable section 210 is formed within opening 204. As shown, first non-anodizable section 210 does not fully fill opening 204, but instead fills the bottom portion of opening 204. First non-anodizable section 210 can be made of any suitable material including plastic, glass and/or ceramic. In some applications, non-anodizable section 210 is made of a radio frequency transparent material (e.g., radio frequency transparent plastic) that allows radio frequency waves to pass there through to and/or from a radio frequency antenna. First non-anodizable section 210 can act as a structurally supportive portion within opening 204. Thus, in some embodiments, first non-anodizable section 210 can be made of a structurally rigid material such as a hard plastic. First non-anodizable section 210 can be formed using any suitable method. In some embodiments, first non-anodizable section 210 is molded while in molten form within opening 204 and allowed to harden, securing first non-anodizable section 210 to anodizable section 202.

Figure 2C:
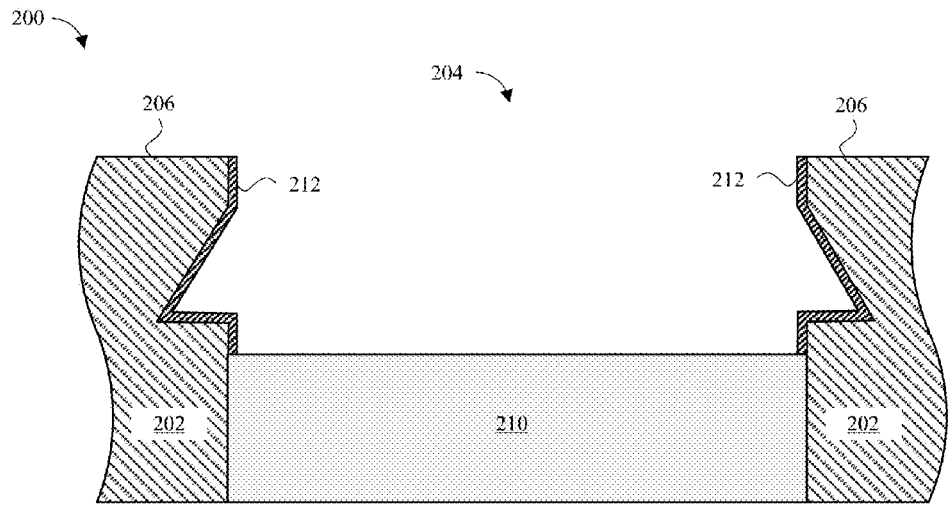

At FIG. 2C, filler layer 212 is deposited on anodizable section 202 along internal surfaces of opening 204. As described above with reference to part 100, filler layer 212 can be made of any material suitable for preventing material from entering within a gap formed between anodizable section 202 and a subsequently formed second non-anodizable section. In some embodiments, filler layer 212 is made of a metal material, such as nickel and/or copper and is deposited using plating techniques. In some embodiments, filler layer 212 includes two or more sub-layers. For example, filler layer 212 can include a first layer that is a thin conformal and uniform layer that is deposited electrolessly and a second layer that is a bulk metal layer that is deposited using electroplating techniques. The second layer can have a porous structure that provides engagement surfaces for a subsequently deposited second non-anodizable section to engage with. In some embodiments, surface 206 of part 200 is masked prior to forming filler layer 212. After filler layer 212 is deposited, the mask can be removed exposing surface 206. In other embodiments, filler layer 212 is initially deposited onto exposed surfaces of part 100, including surface 206. Then, portions of filler layer 212 on surface 206 are removed.

Figure 2D:
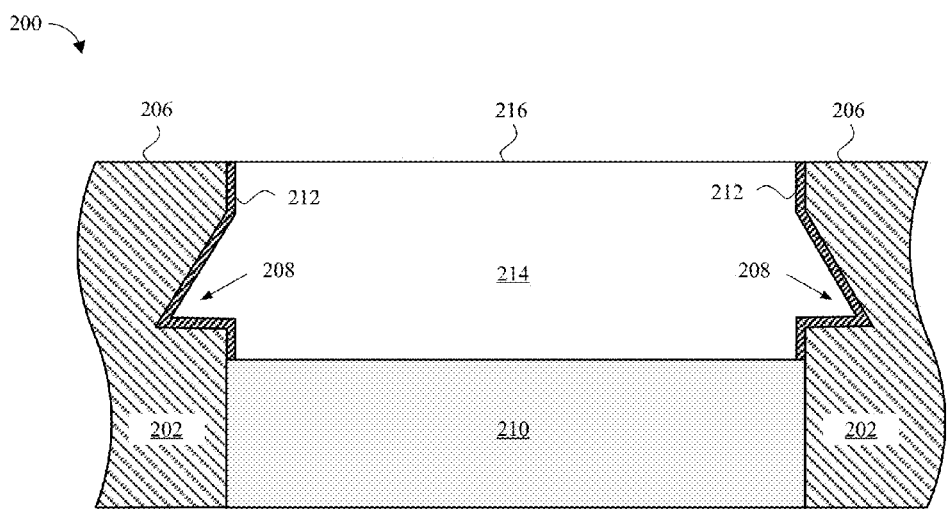

At FIG. 2D, second non-anodizable section 214 is deposited into opening 204 and incorporated into part 200. Second non-anodizable section 214 can be made of any suitable material including plastic, glass and/or ceramic. In some embodiments, top surface 216 corresponds to an exterior surface of part 200. Thus, in some embodiments, second non-anodizable section 214 acts as a cosmetic portion of the part and does not necessarily have the structural properties of first non-anodizable section 210. For example, second non-anodizable section 214 can be made of a less rigid but more aesthetically appealing plastic material than first non-anodizable section 210. Second non-anodizable section 214 can be formed using any suitable method, including molding of second non-anodizable section 214 while in molten form within opening 204 and on top of first non-anodizable section 210. Portions of second non-anodizable section 214 can mold within and conform to the shape of interlock features 208, thereby securing second non-anodizable section 214 to part 200. In embodiments where filler layer 212 includes a porous structure, portions of second non-anodizable section 214 can deposit within the pores of filler layer 212, similar to shown in FIG. 1C. This can further secure second non-anodizable section 214 to part 200. In addition, this creates a tight seal between second non-anodizable section 214 and filler layer 212, thereby assuring that residues will not enter between second non-anodizable section 214 and filler layer 212.

After second non-anodizable section 214 is hardened, part 200 can undergo one or more manufacturing processes. Filler layer 212 can prevent residues and other artifacts from these manufacturing processes from entering between anodizable section 202 and second non-anodizable section 214. Typical manufacturing processes can include shaping, machining and surface treatment processes. For example, surface 206 of anodizable section 202 and surface 216 of second non-anodizable section 214 can be co-finished using a polishing process to form a continuous smooth surface for composite part 200. Other surface treatment processes can include a texturing process, such as a blasting process.

Figure 2E:
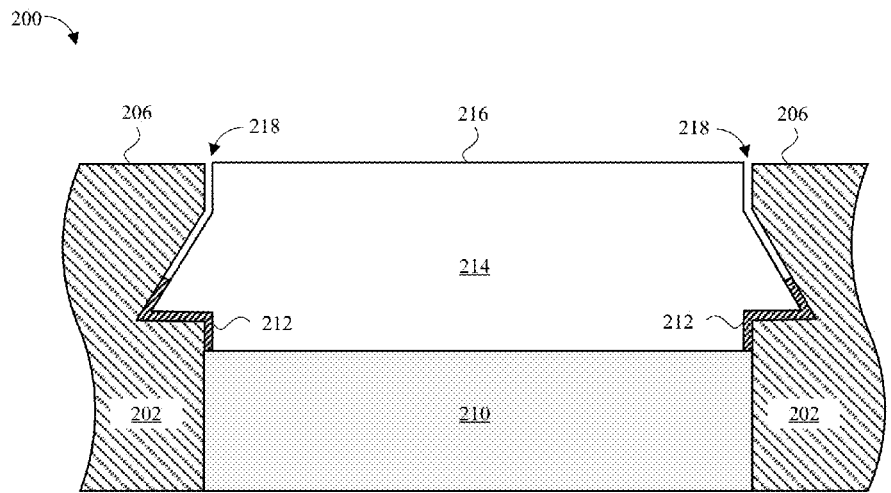

At FIG. 2E, a portion of filler layer 212 is removed leaving gaps 218 between anodizable section 202 and second non-anodizable section 214. In particular, a portion of filler layer 212 that is near exposed surfaces 206 and 216 is removed. In the embodiment shown in FIG. 2E, a portion of filler layer 212 remains within part 200. This can help tightly secure second non-anodizable section 214 to part 200. In other embodiments, substantially all of filler layer 212 is removed. The amount of filler layer 212 removed, i.e., the depth of gap 218, can depend upon the removal technique and process parameters. The width of gap 218 will depend on the thickness of filler layer 212. In embodiments wherein filler layer 212 includes a metal, an electrolytic process can be used to dissolve the removed portion of filler layer 212 into an electrolytic bath. Details of some electrolytic processes suitable for removing filler layer 106 are described below with reference to FIG. 5. After a portion or all of filler layer 212 is removed and gap 218 is formed, part 100 can optionally undergo one or more additional manufacturing processes. For example, one or more surface treatments, such as chemical polishing, can be performed.

Figure 2F:
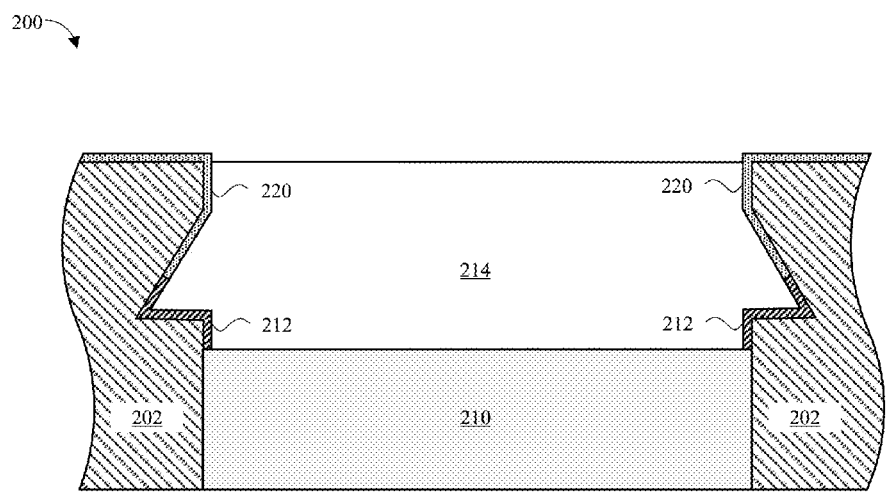

At FIG. 2F, part 200 is exposed to an anodizing process converting a surface portion of anodizable section 202 to metal oxide layer 220. In some embodiments, metal oxide layer 220 substantially fills gap 218. In other embodiments, metal oxide layer 220 does not fully fill gap 218, and instead, leaves a space between metal oxide layer 220 and second non-anodizable section 214, similar to space 128 shown in FIG. 1E. As described above, controlling the thickness metal oxide layer 220 and/or the thickness of filler layer 212 can control the width of the space between metal oxide layer 220 and second non-anodizable section 214. In some embodiments, a post-anodizing cleaning process is used to clean any further residue accumulated within this space prior to a dyeing process. The post-anodizing cleaning process can include, for example, exposing part 200 to an acidic solution.

Figure 2G:
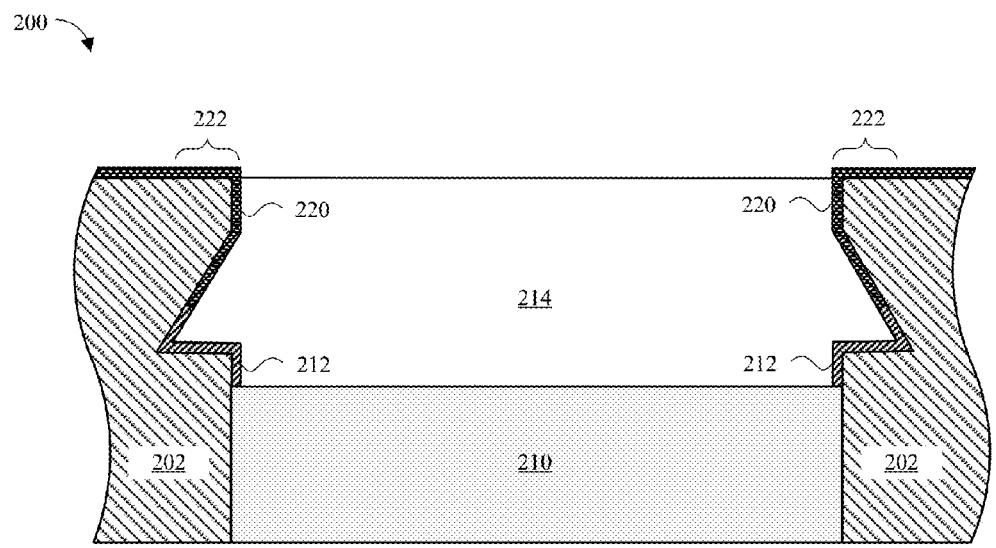

At FIG. 2G, part 200 is exposed to a dyeing process where one or more dyes are infused within metal oxide layer 126. Substantially no residues will remain on or within metal oxide layer 220 at regions 222 proximate second non-anodizable section 214 that can inhibit the dyeing of metal oxide layer 220. Thus, regions 222 will have a consistent color and be substantially free of visible defects.

Figure 3:
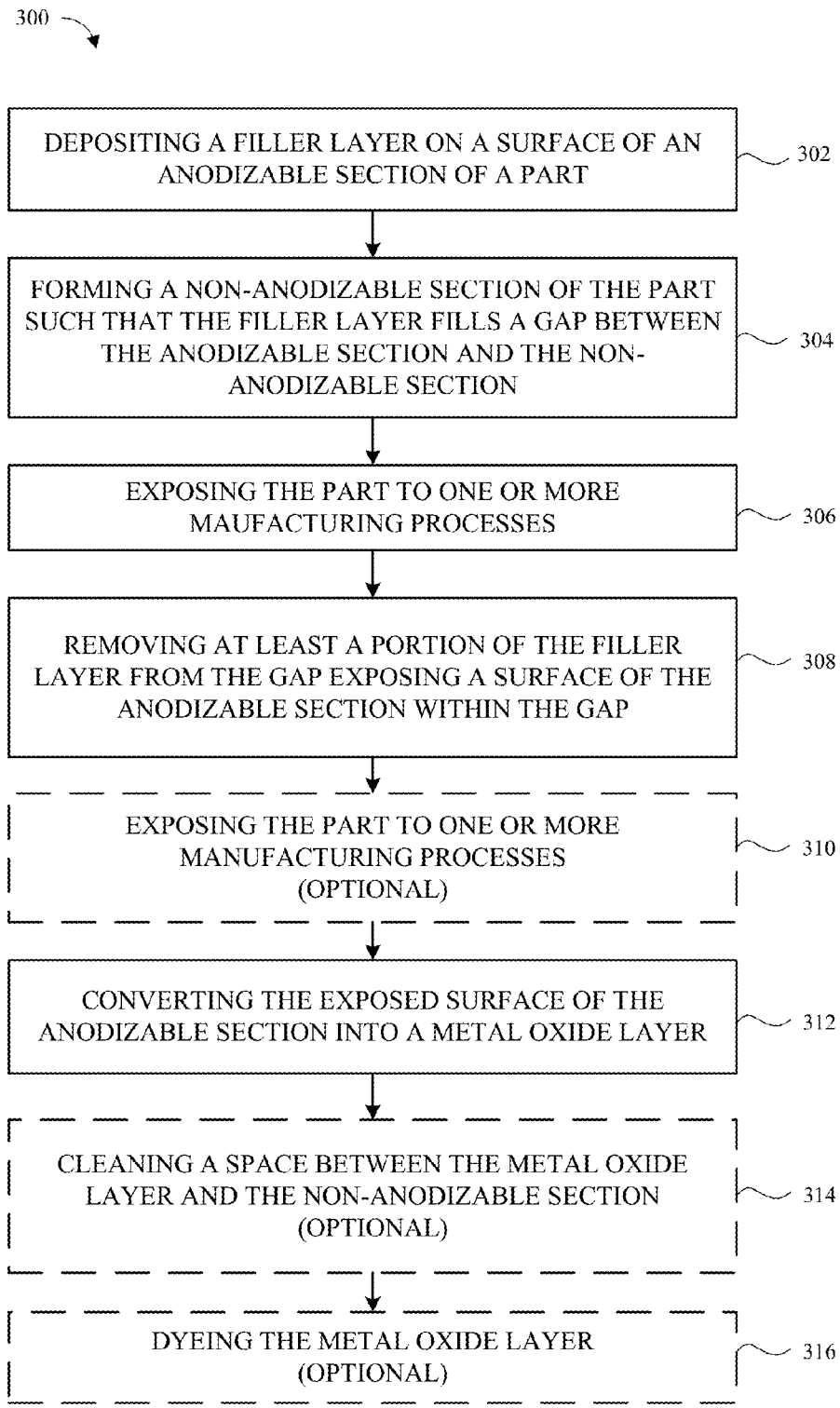
FIG. 3 shows a flowchart indicating a gap filling and anodizing process in accordance with described embodiments.

FIG. 3 shows high-level flowchart 300 indicating a gap filling and anodizing process in accordance with described embodiments. At 302, a filler layer is deposited on a surface of an anodizable section of a part. The anodizable section generally includes a material that forms a metal oxide film when exposed to an anodizing process. Suitable anodizable materials include aluminum, titanium and combinations thereof. In some embodiments, the filler layer includes a metal that is deposited using one or more plating processes. In particular embodiments, the filler layer is made of nickel and/or copper. The choice of filler layer material can depend, in part, on the chemical resistance of the material. For example, in some embodiments, nickel is found to be more chemically resistant to some surface treatment processes compared to copper. As described above, the thickness of the filler layer defines a width of a gap between the anodizable section and a subsequently formed non-anodizable section of the part. Thus, one can control the width of the gap by controlling the thickness of the filler layer. The filler layer can also protect the surface of the anodizable section during manufacturing processes, such as surface treatment and machining processes. When the filler layer is removed, a fresh surface of the anodizable section is provided for an anodizing process.

In some embodiments, the filler layer includes sub-layers. For example, the filler layer can include a thin electrolessly deposited first layer (e.g., electroless nickel layer) that adheres well to the anodizable section and has a conformal and uniform thickness. The filler layer can also include electrolytically deposited porous second layer (e.g., porous nickel layer) that makes up the bulk of the filler layer. A metal filler layer depositing process that includes a first layer and second layer is described in detail below with reference to FIG. 4. Using a metal filler layer with these multiple layers can provide at least two benefits: 1) when removed, it can help create a consistent gap for effective cleaning after anodizing, and 2) it can improve adhesion of the non-anodizable and anodizable sections of the part.

At 304, a non-anodizable section of the part is formed such that the filler layer fills a gap between the anodizable section and the non-anodizable section. The non-anodizable section generally includes a material that does not form a metal oxide film when exposed to an anodizing process. Suitable non-anodizable materials include plastic, ceramic, glass and combinations thereof. In some embodiments, the non-anodizable section is formed by molding a non-anodizable material in molten form onto a surface of the filler layer. In some embodiments, portions of the molten non-anodizable material deposit within pores of the porous bulk layer. Once hardened, the non-anodizable material engages with the porous bulk layer securing the non-anodizable section to the filler layer and to the part.

At 306, the part is exposed to one or more manufacturing processes. The manufacturing processes can include a surface treatment process and/or a machining process. In some embodiments, a surface of the anodizable section and a surface of the non-anodizable section are co-finished. For example, a polishing process can be used to polish surfaces of both the anodizable and non-anodizable sections. Some of these finishing treatments include slurries and other chemicals that can get trapped in gaps and crevices of the part. The filler layer prevents residues from the surface treatment and/or other manufacturing processes from entering the gap between the anodizable and non-anodizable sections.

At 308, at least a portion of the filler layer is removed, exposing a surface of the anodizable section within the gap. The process for removal of the filler layer will depend, in part, on the type of material of the filler layer. In some embodiments where the filler layer is made of metal, an electrolytic removal process is used. During the electrolytic removal process, a voltage is applied to the part and a portion of the metal filler layer dissolves within an electrolytic bath. In some embodiments, the electrolytic process involves using a bath suitable for an anodizing process, such as a sulfuric acid or phosphoric acid bath. The electrolytic process can involve applying a relatively low voltage (compared to anodizing) to the part such that the filler layer is removed without substantially anodizing the part. The electrolytic process can be optimized to provide a gap having a large and consistent depth. Details of factors involved in optimizing an electrolytic metal filler layer removal process are described below with reference to FIG. 5. In some embodiments, the electrolytic removal process for removing a nickel filler layer includes using a voltage of about 6 V or less. In some embodiments, a voltage between about 1 V and 6 V is used.

At 310, the part is optionally exposed to one or more manufacturing processes. For example, one or more surface treatments, such as chemical polishing, can be performed. Any residues trapped within gap can be removed during a subsequent post-anodizing cleaning process. In other embodiments, part goes straight to an anodizing process without undergoing additional manufacturing processes.

At 312, a portion of the exposed anodizable section is converted to a metal oxide layer using an anodizing process. In some embodiments, the anodizing process is performed in the same electrolytic bath as the filler layer removal process at 308. In other embodiments, the anodizing process is performed in a different bath than the filler layer removal process at 308. In some embodiments, the portion of the metal oxide layer formed within the gap has a thickness that is less than the width of the gap, thereby forming a space between the metal oxide layer and the non-anodizable section. The width of this space can be designed to be narrow enough to provide a cosmetically appealing interface between the anodizable and non-anodizable sections of the part but wide enough to allow for efficient cleaning during a subsequent post-anodizing cleaning process.

At 314, the space between the anodizable and non-anodizable sections is optionally cleaning using a post-anodizing cleaning process. In some embodiments, the post-anodizing cleaning process involves exposing the part to an acidic solution for a sufficient time to dissolve any remaining residues trapped within the space between the anodizable and non-anodizable sections. In a particular embodiment, the part is exposed to an acidic solution for a time period ranging from about 5 minutes to about 40 minutes. At 316, the metal oxide layer is optionally dyed using a dyeing process. Any suitable dye or combination of dyes can be used, including one or more organic, inorganic and/or metal dyes. The metal oxide layer takes on a color corresponding to the dye/dyes. The resulting part will have clean, visible defect-free and cosmetically attractive interface between the anodizable and non-anodizable sections.

Figure 4:
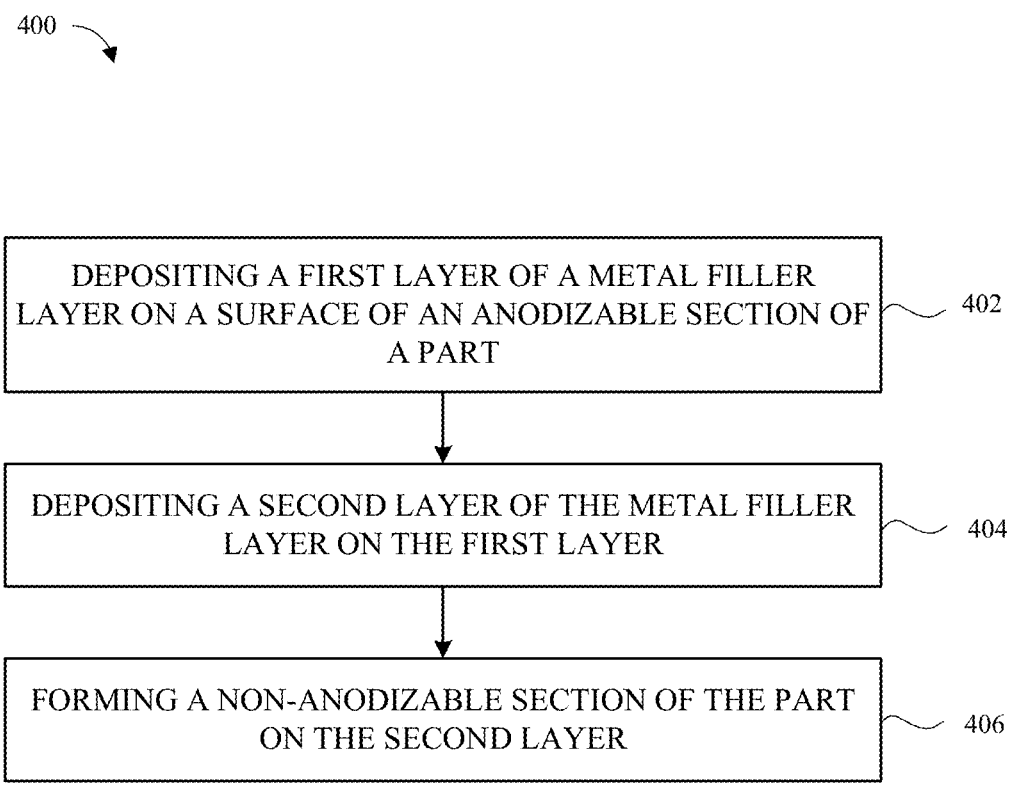
FIG. 4 shows a flowchart indicating a process for forming a metal filler layer in accordance with described embodiments.

FIG. 4 shows flowchart 400 indicating a process for forming a metal filler layer having two sub-layers, in accordance with described embodiments. At 402, a first layer of the metal filler layer is deposited on a surface of an anodizable section of a part. In some embodiments, the first layer is made of nickel, copper or a combination thereof. In some embodiments, the first layer is deposited using an electroless deposition process. Electroless deposition generally relies on chemical reactions at the surface of the substrate (anodizable section) in contrast to electroplating, which relies on electric current through an electrolyte in order to deposit material on a substrate. Electroless deposition generally forms a well-adhered thin conformal metal layer that generally has a more uniform thickness compared to a metal layer formed using electroplating.

At 404, a second layer of the metal filler layer is deposited on a surface of the first layer. In some embodiments, the second layer is made of nickel, copper or a combination thereof. In some embodiments, the second layer is deposited using an electroplating process. Electroplating can generally form a thicker filler layer than electroless deposition. Thus, in some embodiments, the second layer has a greater average thickness than the first layer. The second layer can be plated to a large enough thickness to provide a large enough space for post-anodizing cleaning, described above. However, it can be difficult to form uniform metal layer using electroplating. The thicker the metal layer, the greater the thickness variation. Too much thickness variation will result in a gap that is uneven and cosmetically unappealing. Thus, in some embodiments, the second layer is deposited to a small enough thickness to provide a second layer with a sufficiently cosmetically appealing uniform thickness.

In some embodiments, the second layer has a porous structure in order to enhance adhesion to a subsequently deposited non-anodizable section of the part. Process conditions for forming the filler layer can vary depending on a number of factors including the material of the filler layer, size of the part and desired thickness and porosity. In some embodiments, process conditions for plating a porous second layer are tuned such that the porous second layer has an average pore size sufficient for accepting portions of a particular material of the non-anodizable section. In some embodiments, the average pore size is about 5 micrometers or greater. In particular embodiments, plating of a porous nickel layer includes using a current density ranging from about 0.5 A/dm$^2$ to about 8 A/dm$^2$, a plating bath temperature ranging from about 35 degrees C. to about 55 degrees C., and a nickel concentration ranging from about 100 g/L to about 500 g/L.

At 406, a non-anodizable section of the part is deposited on the second layer. In embodiments where the second layer is porous, portions of the non-anodizable section deposit within the pores of the second layer and engage with the pore walls, thereby securing the non-anodizable section to the part. In addition, having the non-anodizable section so securely adhered to the second layer can assure that residues from subsequent manufacturing processes do not enter between the non-anodizable section and the second layer. These aspects are as described above in detail with reference to FIGS. 1B and 1C.

Figure 5:
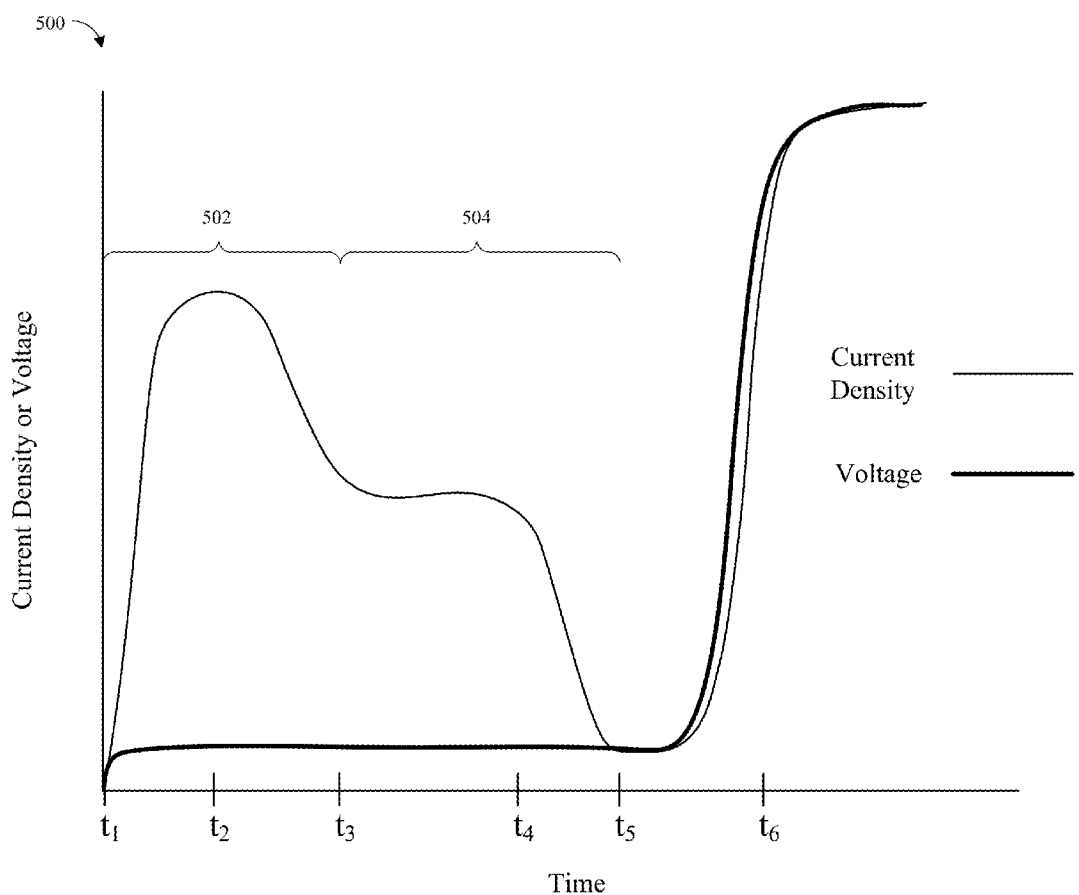
FIG. 5 shows a graph illustrating voltage and current density changes during an electrolytic metal filler layer removal process in accordance with described embodiments.

As described above, in some embodiments the filler layer is a metal filler layer that can be removed using an electrolytic process. Process parameters for the electrolytic metal filler layer removal process can be tuned to control the amount of metal removed and the depth of the resulting gap. FIG. 5 shows graph 500 illustrating voltage and current density changes during an electrolytic metal filler layer removal process in accordance with described embodiments. Graph 500 shows removal of a metal filler layer that includes an electrolessly deposited first metal layer and a electrolytically deposited bulk second metal layer, as described above in some embodiments. The voltage during the removal process corresponds to the amount of voltage from the power supply that is applied to the part. The current density corresponds to the amount of current per area of the part (typically measured in A/dm$^2$). Graph 500 shows a current density curve indicating relative changes in current density over the electrolytic process, shown as a thin line. Graph 500 also shows a voltage curve indicating relative changes in applied voltage over the electrolytic process, shown as a thick line.

Graph 500 shows time period 502 (from time $t_1$ to time $t_3$) corresponding to dissolving of the bulk second metal layer, followed by time period 504 (from time $t_3$ to time $t_5$) corresponding to dissolving of the electrolessly deposited first metal layer. During time period 502, the current density increases when voltage is applied at $t_1$ and reaches a peak at $t_2$. During the time period between $t_1$ and $t_2$ the majority of the bulk second metal layer is removed. From time $t_2$ to $t_3$, the current density decreases as the bulk second metal layer get thinner and resistance increases. Finally at $t_3$ the second metal layer is completely dissolved within electrolytic bath. During time $t_3$ to $t_4$, the current density remains substantially constant as the majority of the electrolytically deposited first metal layer is dissolved. From time $t_4$ to $t_5$, the current density decreases as the first metal layer gets thinner and resistance increases. Finally at $t_5$ the electrolytically deposited first metal layer is completely dissolved within the electrolytic bath. At $t_6$, the voltage is increased and the current density also increases as anodizing begins and the metal substrate starts to convert to metal oxide.

During time periods 502 and 504, corresponding to the removal of the first and second metal layers, the applied voltage is kept substantially constant. The voltage is also kept relatively low compared to the voltage at $t_6$ when anodizing begins. Note that in some embodiments, the voltage can be increased and decreased during the time periods 502 and 504; however, the voltage will preferably remain relatively low compared to the voltage applied at $t_6$. Thus, an electrolytic removal process can be designed for applying a high enough voltage to efficiently remove the first and second metal layers and low enough to substantially avoid the start of anodizing. In some embodiments where the first layer is an electrolessly deposited nickel layer and the second layer is an electrolytically deposited porous nickel layer, the voltage during removal of the first and second metal layers (time periods 502 and 504) is kept below about 6 V. In some embodiments, the voltage is kept below about 3 V. In some embodiments, the voltage is kept between about 1 V and 6 V. In some embodiments, the voltage at $t_6$, corresponding to the start of anodizing, is increased to about 15 V or higher.

The anodizing process can occur in the same electrolytic bath or in a different electrolytic bath than the electrolytic metal filler layer removal process. That is, in some embodiments, after the first and second metal layers are dissolved, the part is transferred to a second electrolytic bath for anodizing. This can prevent particles from the electrolytic metal filler layer removal process from disrupting the anodizing process and creating defects within the resultant metal oxide layer. In some embodiments, the part is transferred to an intermediate bath after the electrolytic metal layer removal bath and prior to transferring into the anodizing bath. This intermediate bath can remove particles on the surface of the part accumulated from the electrolytic metal layer removal process. As described above, in some embodiments, the part undergoes a surface treatment process, such as a chemical polishing or degreasing process, between the electrolytic metal layer removal bath and the anodizing bath. In some embodiments, the part is prevented from being exposed to solutions capable of oxidizing the metal substrate (anodizable section) after the metal filler layer is removed. In some embodiments, the part is transferred between baths in an inert environment, such as a nitrogen or argon environment.

According to some embodiments, a boundary layer is formed on surfaces of an anodizable section of a part that a non-anodizable section is molded onto. This boundary layer can act as a corrosion barrier that prevents corrosion products from developing within gaps between the anodizable and non-anodizable sections. To illustrate, FIGS. 6A-6F show cross-section views of a portion of part 600 at various stages of a process that includes formation of a boundary layer, in accordance with some embodiments. At 6A, opening 604 is formed within anodizable section 602. Anodizable section 602 includes an anodizable metal, such as aluminum and/or titanium. In some embodiments, anodizable section 602 is made of an aluminum alloy. In some embodiments, part 600 is a housing with exterior surfaces 606 and opening 604 corresponds to a channel that runs along perimeters of metal portions of the housing.

Opening 604 can be formed using any suitable process, including one or more machining, molding and shaping processes. Anodizable section 602 includes interlock features 608 that are designed to secure a subsequently formed non-anodizable section within opening 604. Interlock features 608 can have any suitable shapes, such as those having tapered edges so the subsequently formed non-anodizable section can engage with interlock features 608 in a dovetail manner. In some embodiments, interlock features 608 have an undercut shape. According to some embodiments, the shape of interlock features 608 are optimized so that they can be completely filled by the subsequently formed non-anodizable section without substantially any voids that can trap residues. Some of these shapes are described in detail below with reference to FIGS. 7A-7E.

Figure 6A:
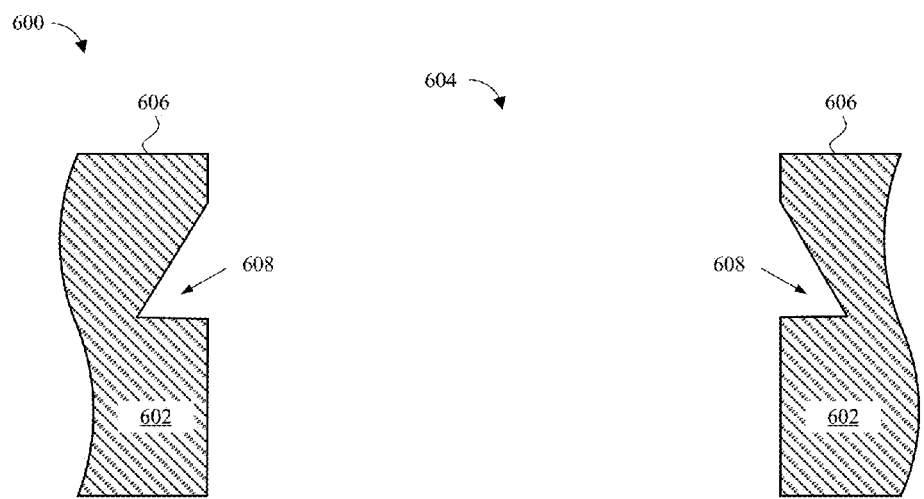
FIGS. 6A-6F show cross-section views of a portion of a part at various stages of manufacture using a boundary layer in accordance with some embodiments.
Figure 6B:
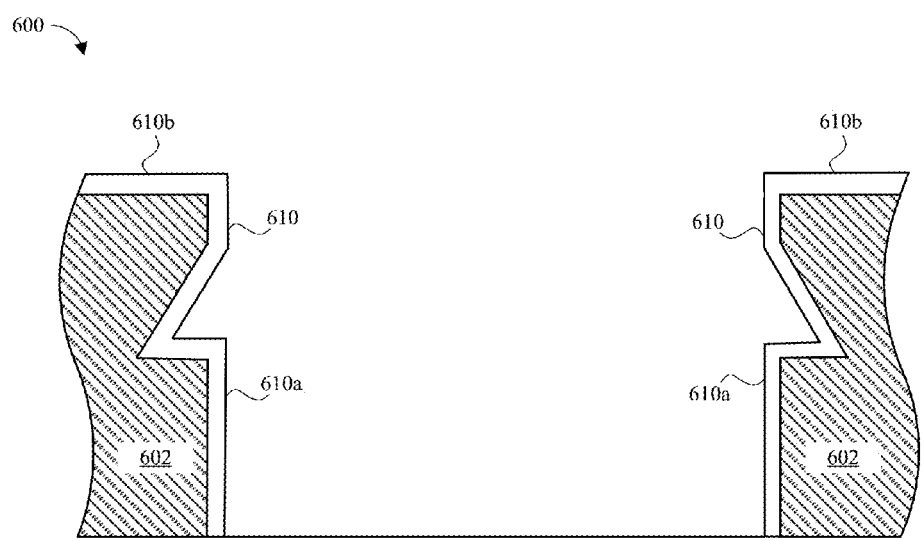

At FIG. 6B, boundary layer 610 is formed on surfaces of anodizable section 602. In some embodiments, first portion 610a of boundary layer 610 is formed on internal surfaces of opening 604 and second portion 610b of boundary layer 610 is formed on exterior surfaces 606. Boundary layer 610 acts as a barrier in that it that keeps residues from one of more subsequent manufacturing processes from reaching anodizable section 602 and causing anodizable section 602 to corrode. This prevents any corrosion products from forming at an interface between anodizable section 602 and a subsequently formed non-anodizable section. As described above, corrosion products can get trapped between anodizable section 602 and a subsequently formed non-anodizable section, which can ultimately disrupt the intake of an anodizing dye and create visible defects in part 600.

In some embodiments, boundary layer 610 is a substantially uniformly thick layer that conforms with and preserves surface features of anodizable section 602. In one embodiment, boundary layer 610 is a metal oxide layer that is formed by anodizing anodizable section 602. Any suitable type of anodizing process can be used. The anodizing process should form a metal oxide layer that is adequately thick to protect anodizable section 602 from exposure to chemicals during the one or more subsequent process that can corrode anodizable section 602. In some cases, the one or more subsequent processes involve exposure of boundary layer 610 to chemicals and/or mechanical abrasion that can erode some or boundary layer 610. This means boundary layer 610 should be relatively thick and/or robust so as to prevent exposure of anodizable section 602, even if some of boundary layer 610 is worn away. In a particular embodiment, boundary layer 610 has a thickness ranging from about 18 micrometers and about 20 micrometers. Boundary layer 610 is generally not used for cosmetic purposes since a majority or all of the visible portion (second portion 610b) will be removed during a subsequent removal process. Therefore, boundary layer 610 is typically not dyed or polished. In some embodiments, boundary layer 610 is sealed using an anodic sealing process to make boundary layer 610 less porous and susceptible to damage, thereby improving the erosion resistance of boundary layer 610 and protection of anodizable section 602.

In some embodiments, boundary layer 610 is an electro-coating (e-coating). E-coating generally involves the use of electric current to deposit a paint or coating onto a part. The e-coating process can involve placing part 600 in a solution having a suspended coating material and applying a voltage to the solution so that the coating material adheres onto surfaces of part 600. In some cases part 600 is then heated or baked after the coating process is complete. In some embodiments, the coating material is a polymer material, such as a urethane material. One difference between a boundary layer 610 made of a polymer e-coat material versus a metal oxide material is that a polymer e-coating can be made of a compliant polymer that is less brittle than a metal oxide material. A compliant polymer e-coating can be less susceptible to chipping damage during, for example, a subsequent machining process of part 600. After boundary layer 610 is deposited, part 600 can optionally undergo one or more manufacturing processes, such as one or more machining, shaping and finishing processes. Boundary layer 610 prevents exposure of anodizable section 602, thereby preventing formation of any corrosion products related to the exposure of anodizable section 602 to corrosive chemical agents.

Figure 6C:
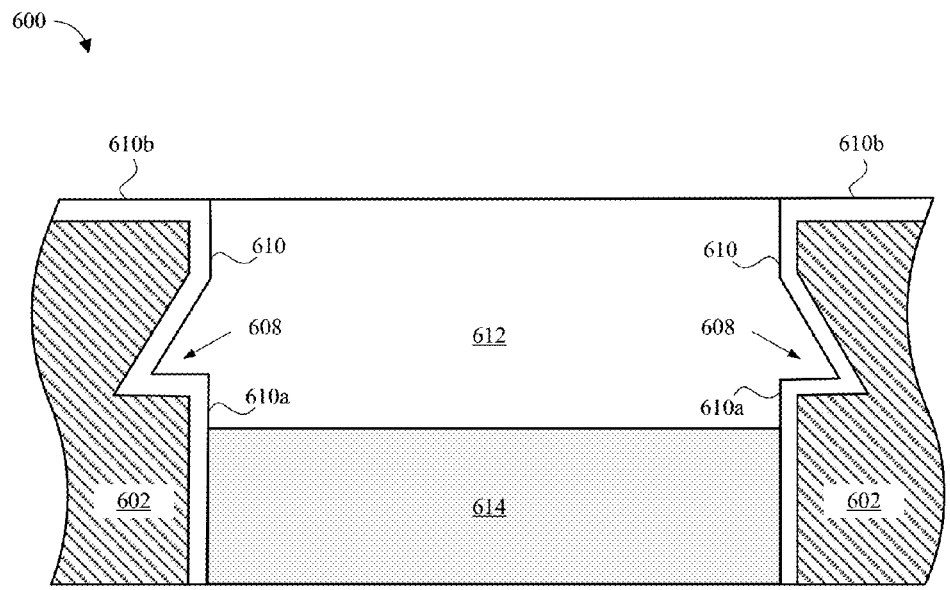

At FIG. 6C, non-anodizable section 612 is deposited into opening 604 making part 600 a composite part. Non-anodizable section 612 is deposited onto surfaces of first portion 610a of boundary layer 610 and defines a border or boundary of anodizable section 602. Non-anodizable section 612 can be made of any suitable material including plastic, glass and/or ceramic. In some applications, part 600 corresponds to a housing for an electronic device and non-anodizable section 612 is made of a radio frequency transparent material (e.g., radio transparent frequency plastic) so that radio frequency waves can pass to and/or from an antenna positioned within the housing. In some cases non-anodizable section 612 is molded into opening 604 using, for example, an injection molding process. In some embodiments, non-anodizable section 612 acts as a cosmetic portion of part 600 in that non-anodizable section 612 corresponds to a visible portion of part 600. In some embodiments, part 600 also includes piece 614, which can be another non-anodizable section made of plastic, glass and/or ceramic. Piece 614 can act as a structural support to non-anodizable section 612 and therefore can be made of a more rigid material than non-anodizable section 612, such as a hard plastic. In some embodiments, piece 614 is also radio frequency transparent. Piece 614 can be formed using any suitable method, such as a molding process.

Since boundary layer 610 covers anodizable section 602, non-anodizable section 612 is deposited onto surfaces of boundary layer 610. Thus, boundary layer 610 is sandwiched between anodizable section 602 and non-anodizable section 612. Boundary layer 610 prevents exposure of anodizable section 602 to chemical agents during the depositing of non-anodizable section 612 that may cause formation of corrosion products. As non-anodizable section 612 is deposited within opening 604, portions of non-anodizable section 612 are deposited within and engage with interlock features 608, thereby securing non-anodizable section 612 to anodizable section 602. This can keep non-anodizable section 612 from being dislodged from opening 604 and falling out of part 600 when part 600 is manipulated or inverted. In some embodiments, the shapes of interlock features 608 are designed to minimize or eliminate formation of voids between non-anodizable section 612 and anodizable section 602. Other interlock feature shapes are described below with reference to FIGS. 7A-7E.

Figure 6D:
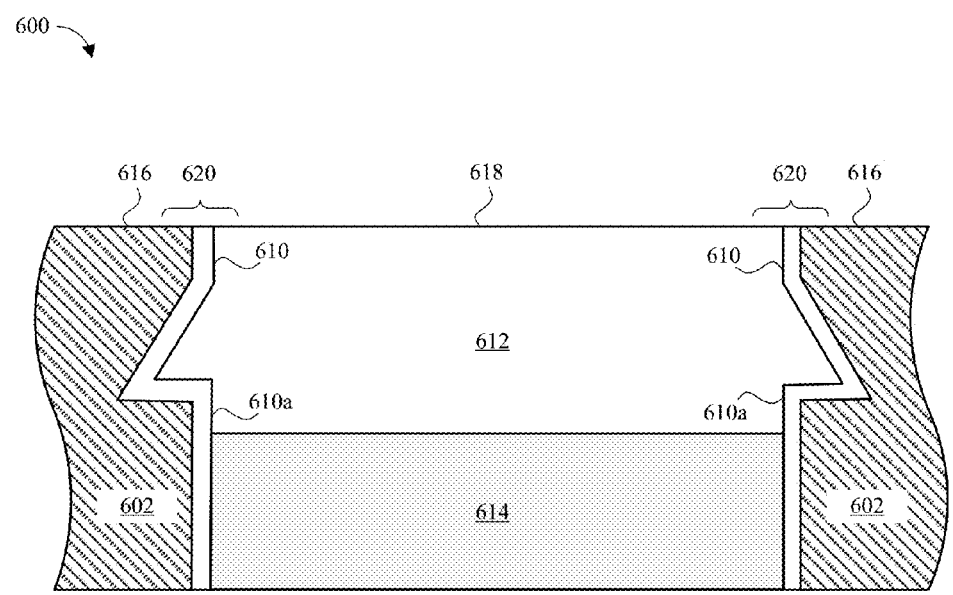

After non-anodizable section 612 is deposited and sufficiently hardened, part 600 can undergo one or more shaping processes. FIG. 6D shows part 600 after a portion of boundary layer 610 is removed. In particular, second portion 610b of boundary layer 610 is removed, resulting in part 600 having exposed surfaces 616 and 618. This can be accomplished using a machining process whereby second portion 610b and some of non-anodizable section 612 are cut off. In some cases, some of anodizable section 602 is also cut off. In some embodiments, surfaces 616 and 618 are co-finished using a polishing process to form a continuous smooth exterior surface for composite part 600. Other surface treatment processes can include a texturing process, such as a blasting process.

In some embodiments, the one or more machining, polishing and other operations after forming non-anodizable section 612 can be optimized to prevent entrapment of chemicals and other residues from forming on part 600 and within crevices/gaps of part 600, such as at interface region or junction region 620 between anodizable section 602 and non-anodizable section 612. The one or more machining, polishing and other operations can also be optimized to assure that boundary layer 610 doesn't get damaged since such damage could cause corrosion of anodizable section 602, which can leach into junction region 620. For example, if a machining process is too aggressive, corners of boundary layer 610 can experience chipping or other damage. Thus, the machining process can be optimized to minimize potential chipping while still providing a predetermined surface quality, such as a predetermined amount of polish or texture (e.g., blasted texture) for surfaces 616 and/or 618. It should be noted that any of the processes described above with respect to FIGS. 6A-6D can be adjusted and optimized to prevent formation of corrosion products and other residues at junction region 620 in order to provide an acceptable mass production yield of composite part 600.

After non-anodizable section 612 is formed and composite part 600 is machined or otherwise processed, part 600 can be cleaned using one or more cleaning processes to remove any residues that may have formed on part 600, and particularly at junction region 620. Note that part 600 can also be cleaned after any of the processes described above with respect to FIGS. 6A-6C in order to provide an acceptable mass production yield of composite part 600.

Figure 6E:
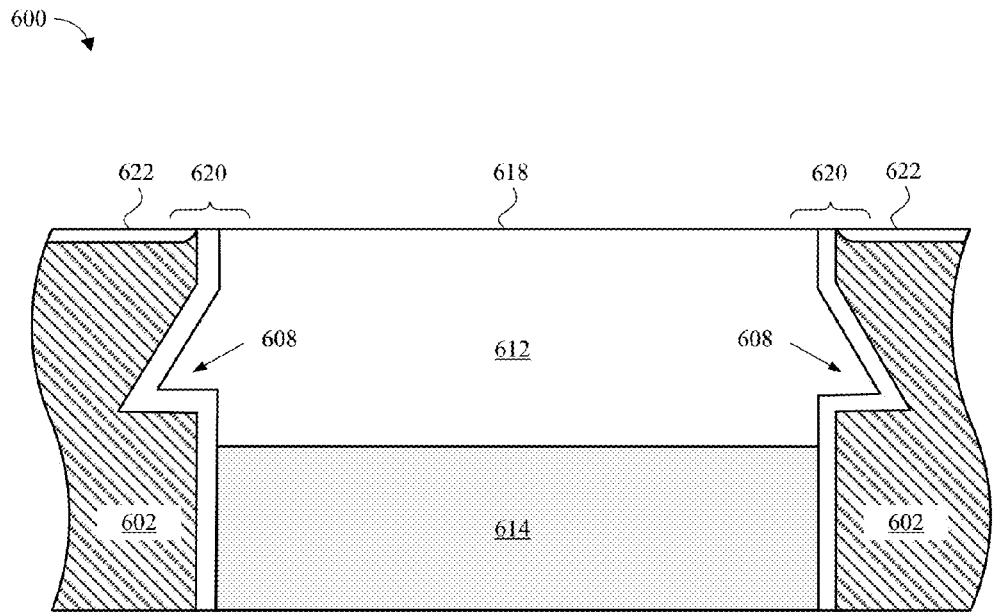

At FIG. 6E, part 600 is exposed to an anodizing process converting exposed surface portions of anodizable section 602 to metal oxide layer 622. In some embodiments, surface 618 of non-anodizable section 612 is masked prior to exposure to the anodizing process in order to protect degradation of non-anodizable section 612. In other embodiments, non-anodizable section 612 is made of a material sufficiently durable to withstand an anodizing process without degrading. Metal oxide layer 622 can provide a durable protective layer for anodizable section 602. For example, if anodizable section 602 is made of aluminum or aluminum alloy, metal oxide layer 622 can correspond to a protective aluminum oxide layer. The thickness of metal oxide layer 622 can vary depending on application requirements. In some embodiments, metal oxide layer 622 has a thickness ranging between about 8 micrometers and about 10 micrometers.

After metal oxide layer 622 is formed, it may be important to clean part 600 to remove any residues, especially prior to an anodic dyeing process to make sure there are no chemicals or other residues that could disrupt the uptake of the dye. In some embodiments, this involves rinsing part 600 in a series of acidic solutions, such as sulfonic acid solutions. In some embodiments, ultrasonic vibration is applied to one or more of the acidic solutions to provide extra cleaning action. In some embodiments, part 600 is rinsed in water between each of the acidic solution cleanings. In some embodiments, part 600 is additionally exposed to a desmutting solution, such as a nitric acid solution, to provide a cleaning solution that has a different viscosity than a sulfonic acid solution, which can help remove residues within crevices of part 600.

Figure 6F:
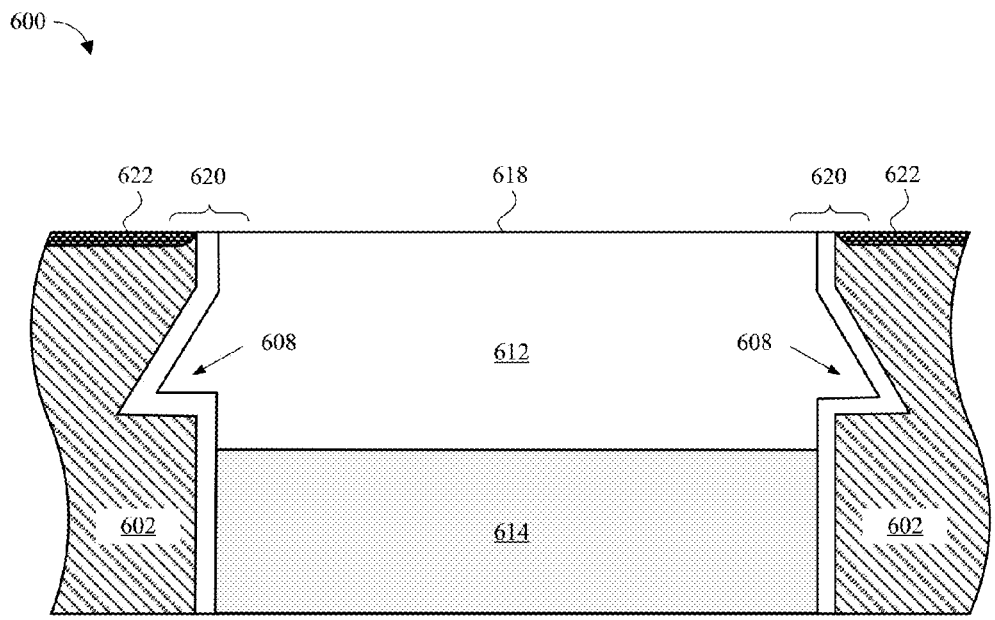

At FIG. 6F, part 600 is optionally exposed to a dyeing process where one or more dyes are infused within metal oxide layer 622. As a result, metal oxide layer 622 takes on a color corresponding to the dye/dyes. Since processes described above have been optimized to eliminate the presence of residues (e.g., corrosion products) at junction region 620, metal oxide layer 622 is clean enough to evenly uptake the dye/dyes. Thus part 600 has consistent color and is substantially free of visible defects, including at junction region 620. In addition, since boundary layer is substantially uniform in thickness, boundary layer provides a consistent and uniform border for anodizable section 602, giving part 600 clean and consistent lines.

As described above, interlock features 608 are shaped to secure non-anodizable section 612 with anodizable section 602. In some cases interlock features 608 have a dovetail design or an undercut design. In some embodiments, the shapes of the interlock features can be optimized to prevent formation of voids when a non-anodizable section is deposited within the interlock features. FIGS. 7A-7E show cross-section views of portions of anodizable sections having different shaped interlock features, in accordance with some embodiments. The shapes of interlocking features shown in FIGS. 7A-7E are exemplary and not meant to limit a size and shape of other possible shapes within the scope of the present disclosure.

Figure 7A:
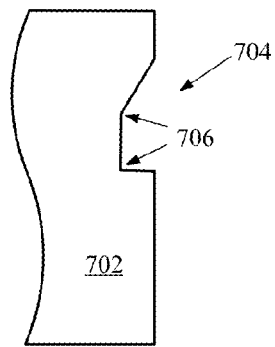
FIGS. 7A-7E show cross-section views of portions of anodizable sections having different shaped interlock features in accordance with some embodiments.

FIG. 7A shows anodizable section 702 having interlock feature 704. A conformal boundary layer can be formed on surfaces of anodizable section 702, including on surfaces of interlock feature 704. A subsequently deposited non-anodizable section can then be deposited on the boundary layer. Interlock feature 704 has a cross-section that includes surfaces that meet at corners 706. Note that corners 706 have angles that have lower aspect ratios (i.e. shallower) than the corners of interlock features 608 described above with respect to FIGS. 6A-6F. That is, the surfaces of corners 706 have less acute angles compared to interlock features 608 described above. In some embodiments, angles 706 of interlock feature 704 are less than or equal to about 90 degrees. This way, the shape of interlock feature 704 more closely matches a shape or radius of the non-anodizable section as it is being deposited (e.g., injection molded) within interlock feature 704. This will assure that the non-anodizable section will completely fill interlock feature 704 without forming voids between the non-anodizable section and the boundary layer where corrosion products and/or other residues can become trapped. Chemicals and other residues trapped within such voids can be difficult to clean out and can travel up to the junction region between the anodizable section and the non-anodizable section causing the visible defects described above. However, interlock feature 704 should still have a high enough aspect ratio to allow for a subsequently formed boundary layer to adequate engage with a non-anodizable section.

Figure 7B:
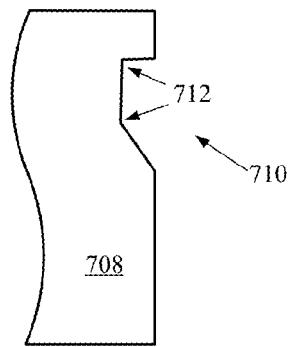
Figure 7C:
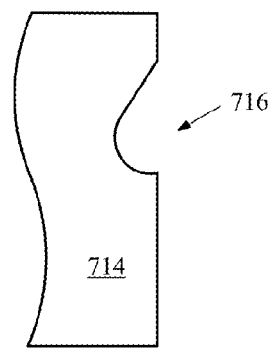
Figure 7D:
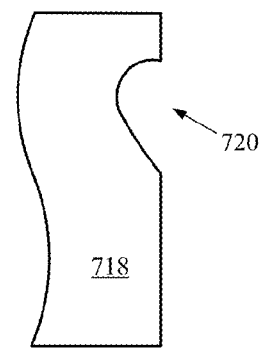
Figure 7E:
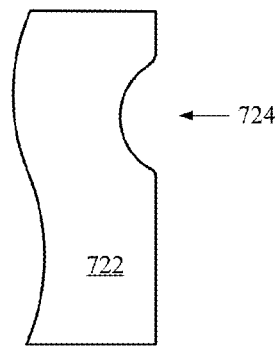

FIG. 7B shows another embodiment of an interlock feature 710 formed within anodizable section 708. Interlock feature 710 also has a low aspect ratio but has a different shape than interlock feature 704. In some embodiments, angles 712 are less than or equal to about 90 degrees. In some embodiments, the interlock features have curved surfaces. FIG. 7C shows anodizable section 714 with interlock feature 716, which has a curved surface. FIG. 7D shows anodizable section 718 with interlock feature 720, which has a curved surface in a different arrangement than the curved surface of interlock feature 716. FIG. 7E shows anodizable section 722 with interlock feature 724, which has a curved surface having a different shape than the curved surfaces of interlock feature 716 and interlock feature 720. In particular, interlock feature 724 has a symmetrical cross-section curved shaped surface.

The interlock features of FIGS. 7A-7E can be formed using any suitable method, including any suitable machining process. In other embodiments, the interlock features are in the form of protrusions rather than recesses within an anodizable section. The shape of the protrusions can likewise be optimized to prevent formation of voids where chemicals and other residues can become entrapped. In some cases the interlock features include a combination of recesses and protrusions.

Figure 8:
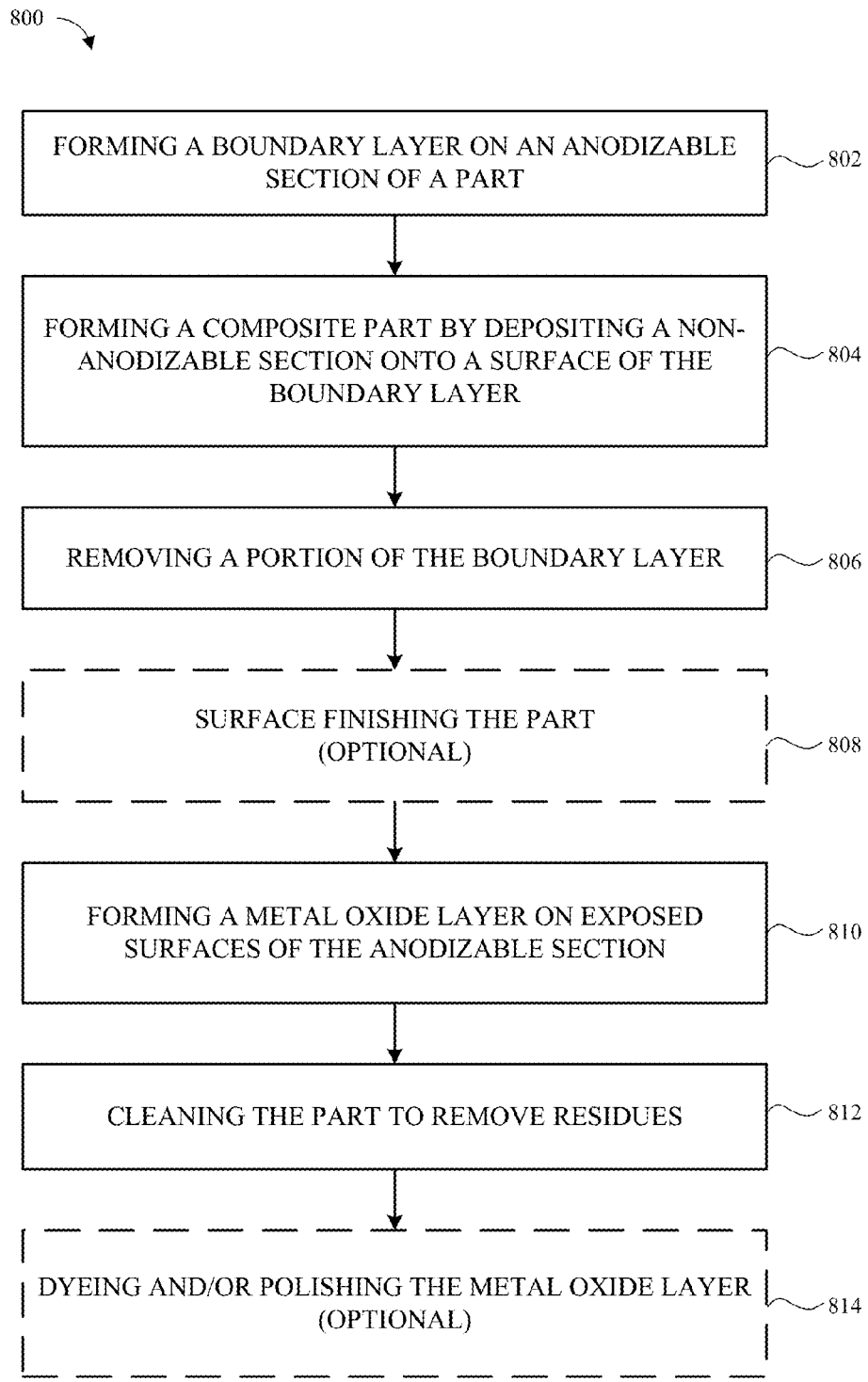
FIG. 8 shows a flowchart indicating a process for forming a composite part using a boundary layer in accordance with embodiments described with reference to FIGS. 6A-6F and 7A-7E.

FIG. 8 shows flowchart 800 indicating a process for forming a composite part using a boundary layer in accordance with embodiments described above with reference to FIGS. 6A-6F and 7A-7E. At 802 a boundary layer is formed on a surface of an anodizable section of a part. The boundary layer prevents exposure of the anodizable section to one or more chemical agents that can cause the anodizable section to form corrosion products. In some embodiments, the boundary layer is a metal oxide layer formed using an anodizing process. In some embodiments, the boundary layer is an e-coating, such as a polymer layer deposited using an e-coating process. The boundary layer should be thick enough to prevent exposure of the anodizable section during subsequent manufacturing processes. The thickness of the boundary layer can define a width of a gap between the anodizable section and a subsequently formed non-anodizable section of the part.

At 804, the composite part is formed by depositing a non-anodizable section on a surface of the boundary layer. The non-anodizable section generally includes a material that does not form a metal oxide film when exposed to an anodizing process, such as plastic, ceramic, glass or combinations thereof. In some embodiments, the non-anodizable section is deposited by molding a non-anodizable material in molten form onto the surface of the boundary layer. In some embodiments, the anodizable section has one or more interlock features that have surfaces that engage with the non-anodizable section. The interlock features can be in from of recesses, protrusion or a combination of recesses and protrusions. The interlock features can have surface geometries that are designed to prevent formation of voids when the non-anodizable section is deposited within the interlock features. For example, the interlock features can have a low aspect ratio cross-section. This way, substantially all surfaces of the boundary layer that formed within interlock feature 704 will be engaged with the non-anodizable section.

At 806, a portion of the boundary layer is removed exposing a surface of the anodizable section. In some embodiments this involves co-machining the anodizable section and the non-anodizable section. At 808, the machined surface of the part is optionally finished using one or more of a polishing or texturing process (e.g., blasting or etching). In some embodiments, a surface of the anodizable section and a surface of the non-anodizable section are co-finished.

At 810, a metal oxide layer is formed on the exposed anodizable section. In some applications, the metal oxide layer corresponds to a protective and cosmetic exterior coating for the part. The thickness and the nature of the metal oxide layer can vary depending on application needs. At 812, the part is cleaned to remove any residues, such as chemicals and/or particles that formed during one or more of the processes 802-810 described above. In some cases the cleaning involves exposing the part to a series of different cleaning solutions (e.g., sulfonic and nitric acid solutions) and rinsing solutions (e.g., water). In some embodiments, sonic vibration (e.g., ultrasonic vibration) is applied to the cleaning and/or rinsing solutions to provide a cleaning action to the solution and assure thorough cleaning of the part.

At 814, the metal oxide layer is optionally dyed and/or polished. Any suitable dye or combination of dyes can be used, including one or more organic, inorganic and/or metal dyes. The polishing can be chosen to provide a polished and attractive exterior surface to one or both of the anodizable section and the non-anodizable section. The resulting composite part has clean and visible defect-free cosmetic surface. In addition, the gap or space between the anodizable section and the non-anodizable section is consistent and uniform. Note that one or all of the processes 802-814 described above can be optimized to reduce or eliminate formation of residues, such as corrosion products. Additionally, one or more cleaning and/or rinsing processes can be implemented between any two of the processes 802-814 in order to assure elimination of such residues.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. A method of forming a housing for an electronic device, the housing including an anodizable section and non-anodizable section, the method comprising:
    forming a boundary layer on the anodizable section, the boundary layer configured to prevent exposure of the anodizable section to a chemical agent that causes the anodizable section to form a corrosion product that is associated with defects;
    molding the non-anodizable section onto the boundary layer such that the boundary layer is situated between the anodizable section and non-anodizable section at a junction region;
    removing a portion of the boundary layer exposing a surface of the anodizable section; and
    converting the exposed surface to a metal oxide layer, wherein the boundary layer prevents formation of the corrosion product at the junction region during one or more of the molding, removing, and converting such that the junction region is defect-free.

2. The method of claim 1, wherein the boundary layer has a uniform thickness.

3. The method of claim 1, wherein the metal oxide layer is a first metal oxide layer and the boundary layer is a second metal oxide layer, wherein forming the boundary layer comprises:
    converting exposed surfaces of the anodizable section to the second metal oxide layer.

4. The method of claim 1, further comprising:
    after the converting, infusing a dye into the metal oxide layer, wherein the corrosion product disrupts infusion of the dye at the junction region.

5. The method of claim 4, further comprising:
    prior to infusing dye into the metal oxide layer, cleaning the housing using one or more acidic solutions.

6. The method of claim 5, wherein cleaning the housing comprises:
    rinsing the housing in a series of different acidic solutions.

7. The method of claim 5, wherein sonic vibration is applied to the one or more acidic solutions to provide a cleaning action that assists cleaning of the housing.

8. The method of claim 1, wherein forming the boundary layer comprises:
    electrocoating the boundary layer onto the anodizable section.

9. The method of claim 8, wherein the boundary layer is comprised of a polymer.

10. The method of claim 1, further comprising:
    prior to forming the boundary layer, forming an interlock feature on the anodizable section, the interlock feature having engagement surfaces that engage with the non-anodizable section and secure the non-anodizable section to the anodizable section.

11. The method of claim 10, wherein the interlock feature is a recess within the anodizable section, wherein molding the non-anodizable section onto the anodizable section includes depositing a portion of the non-anodizable section within the recess.

12. The method of claim 10, wherein the interlock feature has a low aspect ratio such that substantially no voids are formed between the non-anodizable section and the boundary layer.

13. A method of forming a housing for an electronic device, the housing including a metal section and a plastic section, the method comprising:
    forming a boundary layer on the metal section, wherein a first portion of the boundary layer is formed on a first surface of the metal section and a second portion of the boundary layer is formed on a second surface of the metal section, wherein the boundary layer is configured to prevent exposure of the metal section to a chemical agent that causes the metal section to form a corrosion product that is associated with defects;
    molding the plastic section onto the first portion of the boundary layer such that the boundary layer is situated between the metal section and plastic section at a junction region;
    removing the second portion of the boundary layer exposing a surface of the metal section; and
    converting the exposed surface to a metal oxide layer, wherein the boundary layer prevents formation of the corrosion product at the junction region during one or more of the molding, removing, and converting such that the junction region is defect-free.

14. The method of claim 13, wherein the first surface and the second surface of the metal section meet at corner, wherein the junction region is at corner.

15. The method of claim 13, wherein the metal oxide layer corresponds to an exterior surface of the housing.

16. The method of claim 13, wherein removing the second portion comprises:
    cutting off the second portion of the boundary layer and a portion of the plastic section.

17. A housing for an electronic device, the housing comprising:
    a metal section having a first surface and a second surface that meet at a corner, wherein the first surface has a boundary layer positioned thereon and the second surface has a metal oxide layer positioned thereon, wherein the boundary layer has a substantially uniform thickness, wherein an exposed surface of the metal oxide layer corresponds to an exterior surface of the housing; and a plastic section directly adjacent the boundary layer such that the boundary layer is positioned between the plastic section and the first surface of the metal section.

18. The housing of claim 17, wherein the first surface of the metal section includes an interlock feature and the boundary layer conforms to a shape of the interlock feature, wherein the plastic section engages with boundary layer at the interlock feature securing the plastic section to the metal section.

19. The housing of claim 18, wherein the shape of the interlock feature is characterized as having a low aspect ratio.

20. The housing of claim 18, wherein the electronic device includes a radio frequency antenna, wherein the plastic section is comprised of a radio frequency transparent material that allows radio frequency waves to pass there through to or from the radio frequency antenna.

* * * * *